US008103230B2

(12) United States Patent
Yamada

(10) Patent No.: US 8,103,230 B2
(45) Date of Patent: Jan. 24, 2012

(54) BROADCASTING RECEIVER, BROADCASTING IDENTIFICATION METHOD, BROADCASTING IDENTIFICATION PROGRAM, AND RECORDING MEDIUM THEREFOR

(75) Inventor: Tetsuya Yamada, Kawagoe (JP)

(73) Assignee: Pioneer Corporation, Tokyo (JP)

( * ) Notice: Subject to any disclaimer, the term of this patent is extended or adjusted under 35 U.S.C. 154(b) by 204 days.

(21) Appl. No.: 12/676,913

(22) PCT Filed: Sep. 28, 2007

(86) PCT No.: PCT/JP2007/069020
§ 371 (c)(1),
(2), (4) Date: Mar. 8, 2010

(87) PCT Pub. No.: WO2009/040940
PCT Pub. Date: Feb. 4, 2009

(65) Prior Publication Data
US 2010/0197253 A1 Aug. 5, 2010

(51) Int. Cl.
*H04B 1/18* (2006.01)
(52) U.S. Cl. .......... 455/150.1; 455/3.01; 455/179.1; 455/188.1
(58) Field of Classification Search .......... 455/3.01, 455/3.02, 131, 142, 143, 150.1, 161.1, 161.3, 455/179.1, 188.1, 22, 6.1, 226.2
See application file for complete search history.

(56) References Cited

U.S. PATENT DOCUMENTS

| 6,714,600 | B1 | 3/2004 | Okanobu |
| 6,741,293 | B1 * | 5/2004 | Obuchi .......................... 348/554 |
| 7,164,894 | B2 * | 1/2007 | Nagahama et al. .......... 455/3.01 |
| 7,375,771 | B2 * | 5/2008 | Naoi et al. .................... 348/732 |
| 7,787,842 | B2 * | 8/2010 | Yoshida ....................... 455/161.1 |
| 2005/0020220 | A1 | 1/2005 | Gamou |

FOREIGN PATENT DOCUMENTS

| JP | 2000-004174 | 1/2000 |
| JP | 2005-005819 | 1/2005 |
| JP | 2005-012593 | 1/2005 |
| JP | 2005-333168 | 12/2005 |

OTHER PUBLICATIONS

International Search Report—PCT/JP2007/069020—Dec. 11, 2007.

* cited by examiner

*Primary Examiner* — Quochien B Vuong
(74) *Attorney, Agent, or Firm* — Young & Thompson

(57) ABSTRACT

While sequentially changing the selected channel, a digital broadcast judgment part collects level value $V_W$ of a signal extracted on a wide band, a bandwidth suitable for reproduction of an analog broadcast, reported from a reproduction processing unit as the level detection result, and a signal level value $V_N$ extracted on a narrow bandwidth of about $\Delta F$ for which, in an IBOC system, it is likely that neither a digital nor analog broadcast component is present. This digital broadcast judgment part searches for a channel upon which hybrid broadcasting performed by sequentially judging, for three successive channels, whether the first and second adjacent channel conditions, and a central channel condition are satisfied, only on the basis of the signal level values $V_W$ and $V_N$. Accordingly, when receiving a radio broadcast according to the IBOC system, it is possible to decide promptly whether or not a digital broadcast is included therein.

13 Claims, 14 Drawing Sheets

BROADCASTING RECEIVER, BROADCASTING IDENTIFICATION METHOD, BROADCASTING IDENTIFICATION PROGRAM, AND RECORDING MEDIUM THEREFOR

TECHNICAL FIELD

The present invention relates to a broadcast receiving device, a broadcast identification method, a broadcast identification program, and a recording medium upon which such the broadcast identification program is recorded.

BACKGROUND ART

From the past, radio receiving device which receive broadcast radio waves and reproduce their broadcast contents have been widespread. Although traditionally, as such radio broadcasts, analog broadcasts have been employed, the use of digital broadcasts has advanced in recent years.

One digital broadcasting system is the IBOC (In-Band On-Channel) system, which is employed in the USA. In this IBOC system, hybrid broadcasting is employed, in which a digital broadcast can be appended to an analog broadcast. By doing this, it becomes possible to enhance the sound quality as a result of HD (High Definition) radio broadcasting in which digital broadcasting is employed. In a hybrid broadcast according to this IBOC system, the digital broadcast carrier wave is located in the frequency bands adjacent to the analog broadcast carrier wave, on both its sides.

Now, it is not the case that all broadcasting stations perform hybrid broadcasting. In other words, although hybrid broadcasting may be performed by some broadcasting stations, other broadcasting stations may only perform analog broadcasting. In such a case, for radio broadcasting by the amplitude modulation method, a technique has been proposed of performing auto seek in order to find a broadcasting station which is performing hybrid broadcasting (refer to Patent Document #1, hereinafter termed the "prior art example").

In this prior art example, during auto seek, the system starts from an auto seek start frequency, and, as tuning frequencies, the tuner is sequentially set to frequencies spaced apart by some predetermined frequency interval. And, each time a tuning frequency is set, the electric field intensity of the radio wave which corresponds to that tuning frequency is detected by detecting signal power having the bandwidth of a normal analog broadcast.

Next, from the result of detection of the electric field intensity, a judgment is made as to whether a broadcast wave corresponding to either an analog broadcast or a hybrid broadcast, either of which have a chosen frequency by dialing, is being received. If the result of this judgment is negative, then no decision is made as to whether or not this is a hybrid broadcast, but instead the tuning frequency is changed over.

On the other hand, if the result of this judgment as to whether a broadcast wave corresponding to either an analog broadcast or a hybrid broadcast is being received, either of which have a chosen frequency by dialing, is affirmative, then the received signal is digitally analyzed, and a judgment is made as to whether or not it includes a digital broadcast. As a result, auto seeking for a hybrid broadcast is implemented more rapidly than in the case of, each time a tuning frequency is set, digitally analyzing the received signal and making a judgment as to whether or not a digital broadcast is included.

Patent Document #1: Japanese Laid-Open Patent Publication 2005-12593.

DISCLOSURE OF THE INVENTION

Problems to be Solved by the Invention

With this technique according to the prior art example, when auto seeking for a digital broadcast, it is possible to change over the tuning frequency rapidly from the result of detection of the electric field intensity, since, if the result of the judgment as to whether a broadcast wave corresponding to either an analog broadcast or a hybrid broadcast is being received corresponding to that tuning frequency is negative, then it is possible to manage without performing digital analysis of the received signal. However, if the result of that judgment is affirmative, then it is necessary to perform digital analysis of the received signal, for which a time period of around one second is required.

Due to this, a technique is very much desired for being able to decide whether or not a digital broadcast is included according to the IBOC system promptly, even if the result of the above judgment is affirmative. The provision of a response to this demand is one of the problems which the present invention is intended to solve.

Thus, the present invention has been conceived in consideration of the circumstances described above, and its objective is to provide a broadcast receiving device and a broadcast identification method which, upon the reception of a radio broadcast according to the IBOC system, are capable of promptly deciding whether or not a digital broadcast is included therein.

Means for Solving the Problems

According to a first aspect thereof, the present invention is a broadcast receiving device, characterized by comprising: a tuner part configures to, according to a tuning command, converts a signal in a signal from a signal source, on a frequency band corresponding to said tuning command, to an intermediate frequency signal, which is a signal on an intermediate frequency band whose center frequency is a predetermined frequency; a first filter part configures to, if said predetermined frequency corresponds to a frequency of a carrier wave of an analog radio broadcast wave according to the amplitude modulation method, takes said predetermined frequency as a center frequency, and selects from said intermediate frequency signal and passes through a signal on a first frequency band which is appropriate for reproducing broadcast contents from said analog radio broadcast wave; a second filter part configures to takes said predetermined frequency as a center frequency, and selects from said intermediate frequency signal and passes through a signal on a second frequency band whose bandwidth is narrower than said first frequency band; a first detection part configures to detects a first power level, which is the power level of the signal passed through said first filter part; a second detection part configures to detects a second power level, which is the power level of the signal passed through said second filter means; a tuning control part configures to issues said tuning command to said tuner means; and a judgment_part configures to, on the basis of said first power level and said second power level obtained corresponding to a tuning command in which a specific channel is designated, and said first power level and said second power level obtained corresponding to a tuning command in which at least one adjacent channel to said specific channel is designated, makes a judgment as to whether or not a digital radio broadcast which takes the center frequency of said specific channel as its center frequency is being performed according to the in-band-on-channel method.

And, according to a second aspect thereof, the present invention is a broadcast identification method, characterized by comprising: a tuning process of, according to a tuning command, converting a signal in a signal from a signal source, on a frequency band corresponding to said tuning command, to an intermediate frequency signal, which is a signal on an intermediate frequency band whose center frequency is a predetermined frequency; a first detection process of, if said predetermined frequency corresponds to a frequency of a carrier wave of an analog radio broadcast wave according to the amplitude modulation method, taking said predetermined frequency as a center frequency, extracting from said intermediate frequency signal a signal on a first frequency band which is appropriate for reproducing broadcast contents from said analog radio broadcast wave, and detecting the power level of this extracted signal; a second detection process of taking said predetermined frequency as a center frequency, extracting from said intermediate frequency signal a signal on a second frequency band whose bandwidth is narrower than said first frequency band, and detecting the power level of this extracted signal; and a judgment process of, on the basis of the result of detection by said first detection process and the result of detection by said second detection process when a specific channel has been designated by said tuning command, and the result of detection by said first detection process and the result of detection by said second detection process when at least one adjacent channel to said specific channel has been designated by said tuning command, making a judgment as to whether or not a digital radio broadcast which takes the center frequency of said specific channel as its center frequency is being performed according to the in-band-on-channel method.

According to a third aspect thereof, the present invention is a broadcast identification program, characterized in that it causes a calculation means to execute a broadcast identification method according to the present invention.

According to a fourth aspect thereof, the present invention is a recording medium, characterized in that a broadcast identification program according to the present invention is recorded thereupon, and can be read in by a calculation means.

BEST MODE FOR CARRYING OUT THE INVENTION

In the following, embodiments of the present invention will be explained with reference to the appended drawings. It should be understood that, in the following explanation, the same reference symbols are attached to elements which are the same or equivalent, and duplicated explanation is omitted.

The First Embodiment

Figure 1:
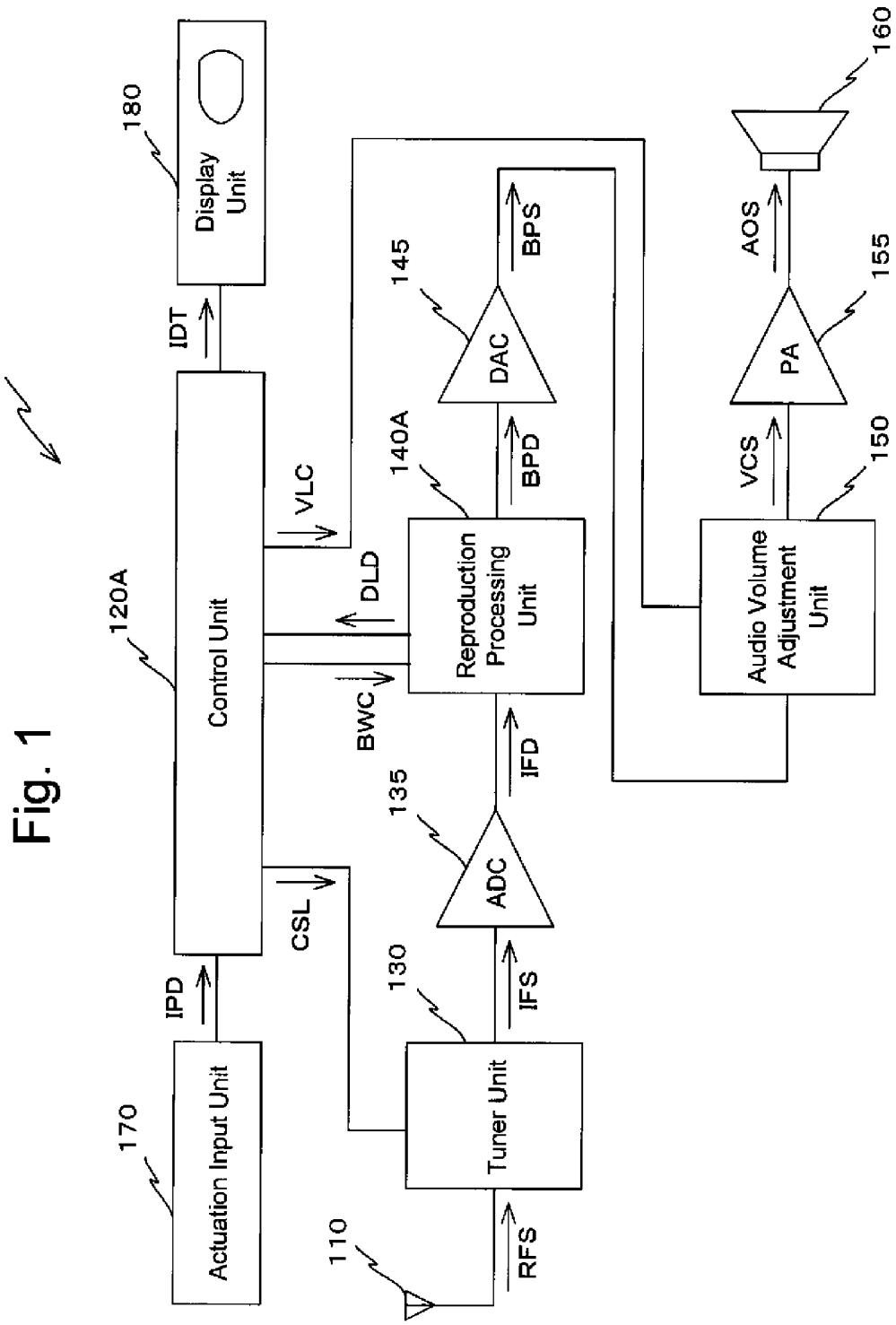
FIG. 1 is a block diagram schematically showing the structure of a broadcast receiving device according to the first embodiment of the present invention.

First, the first embodiment of the present invention will be explained with reference to FIGS. 1 through 13.
<Structure>
FIG. 1 is a block diagram schematically showing the structure of a broadcast receiving device 100A according to the first embodiment. It should be understood that this broadcast receiving device 100A is a broadcast receiving device which is capable of receiving and reproducing an amplitude modulated radio broadcast according to the IBOC system.

As shown in FIG. 1, this broadcast receiving device 100A comprises an antenna 110, a control unit 120A, a tuner unit 130 which serves as a tuner means, and an analog-digital converter (ADC) 135. Moreover, the broadcast receiving device 100A comprises a reproduction processing unit 140A, a digital-analog converter (DAC) 145, an audio volume adjustment unit 150, and a power amplifier 155. Yet further, the broadcast receiving device 100A comprises a speaker 160, an actuation input unit 170, and a display unit 180.

The antenna 110 receives broadcast waves transmitted from broadcasting stations. The result of reception by this antenna 110 is outputted to the tuner unit 130 as a received signal RFS.

Now, the frequency distribution of the signal power of the received signal RFS received by the antenna 110 will be explained. It should be understood that it will be supposed that the center frequency $f_j$ of a physical channel (hereinafter also sometimes simply termed a "channel") which is used for a radio broadcast by the method of amplitude modulation is set in advance. And it will be supposed that the frequency difference between the center frequency $f_j$ of a specified channel and the center frequency $f_{j-1}$ or $f_{j+1}$ of an adjacent channel (hereinafter also sometimes termed the "channel interval") is a constant value $\Delta f$. It should be understood that, in this embodiment, the following explanation is given in terms of "$\Delta f=10$ kHz" being the case.

Figure 2A:
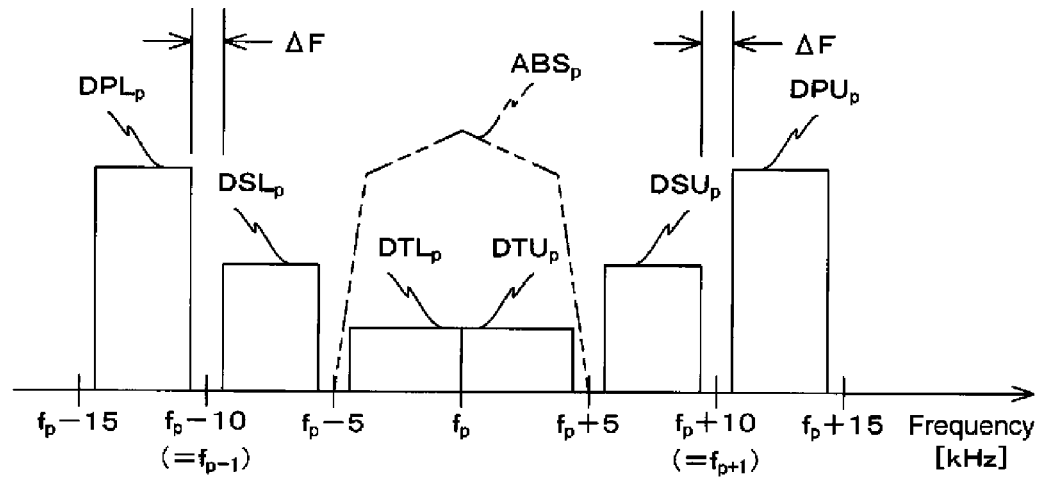
FIG. 2A is the first figure for explanation of a broadcast wave frequency distribution supposed by the device of FIG. 1.

If a hybrid broadcast including both an analog broadcast and a digital broadcast which take the frequency $f_p$ as center frequency is being performed, then, as shown in FIG. 2A, the analog broadcast component $ABS_p$ is included in the frequency range $(f_p-5\text{ kHz})\sim(f_p+5\text{ kHz})$. Moreover, the third upper sideband component $DTU_p$ of the digital broadcast is included in the frequency range $f_p\sim(f_p+5\text{ kHz})$, while the third lower sideband component $DTL_p$ of the digital broadcast is included in the frequency range $(f_p-5\text{ kHz})\sim f_p$.

Furthermore, the second upper sideband component $DSU_p$ of the digital broadcast is included in the frequency range $(f_p+5\text{ kHz})\sim(f_p+10\text{ kHz})$, while the second lower sideband component $DSL_p$ of the digital broadcast is included in the frequency range $(f_p-10\text{ kHz})\sim(f_p-5\text{ kHz})$. Yet further, the first upper sideband component $DPU_p$ of the digital broadcast is included in the frequency range $(f_p+10\text{ kHz})\sim(f_p+15\text{ kHz})$, while the first lower sideband component $DPL_p$ of the digital broadcast is included in the frequency range $(f_p-15\text{ kHz})\sim(f_p-10\text{ kHz})$.

In other words, with a hybrid broadcast which includes both an analog broadcast and a digital broadcast, it is arranged to utilize the frequency bands for three channels: one channel for the center frequency $f_p$, and the two channels adjacent thereto for the upper and lower sidebands. In the following, among these three channels which are employed for this type of hybrid broadcast shown in FIG. 2A, the center channel will be termed the "central channel", while the two channels adjacent to this central channel will be termed the first adjacent channel and the second adjacent channel.

It should be understood that, as shown in FIG. 2A, in the case of a hybrid broadcast, a frequency region of frequency width ΔF, in which no component is located, is present between the frequency band of the upper sideband second component $DSU_p$ of the digital broadcast and the frequency band of its upper sideband first component $DPU_p$. Furthermore, a frequency region of frequency width ΔF, in which no component is located, is also present between the frequency band of the lower sideband second component $DSL_p$ of the digital broadcast and the frequency band of its lower sideband first component $DPL_p$.

Figure 2B:
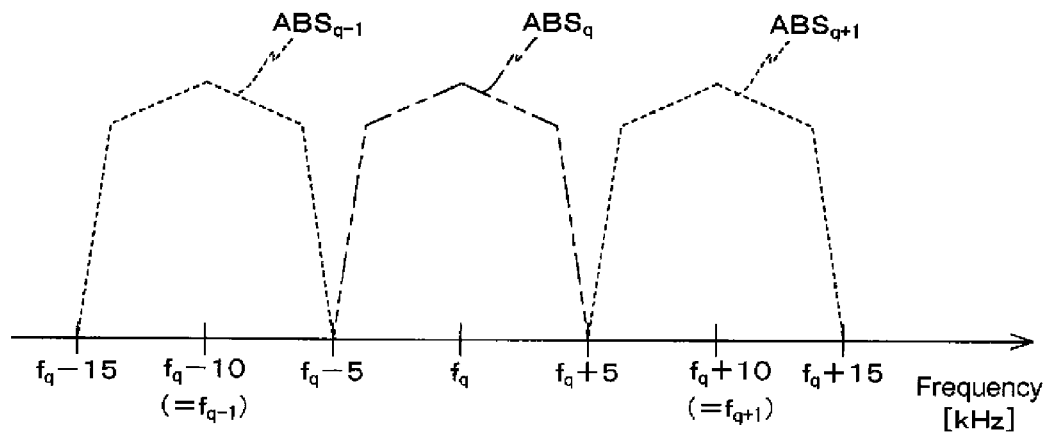
FIG. 2B is the second figure for explanation of the broadcast wave frequency distribution supposed by the device of FIG. 1.

If only analog broadcasting is being performed, with the frequency $f_q$ being taken as the center frequency, then, as shown in FIG. 2B, the analog broadcast component $ABS_q$ is included within the frequency range $(f_q-5\text{ kHz})\sim(f_q+5\text{ kHz})$. Moreover, if analog broadcasting is being performed upon an adjacent channel whose center frequency is $f_{q-1}$ or $f_{q+1}$, then an analog broadcast component $ABS_{q-1}$ or $ABS_{q+1}$ which uses an adjacent channel as shown by the broken line in FIG. 2B is present. On the other hand, if no such analog broadcasting is being performed upon an adjacent channel whose center frequency is $f_{q-1}$ or $f_{q+1}$, then such an analog broadcast component $ABS_{q-1}$ or $ABS_{q+1}$ does not exist.

Although this feature is not shown in FIG. 2B, it should be understood that it may also be the case that, when analog broadcasting only at the center frequency of $f_q$ is being performed, in the frequency region of an adjacent channel, there may be present a signal component of a digital broadcast whose center frequency is a channel adjacent to that adjacent channel. In this case, if a signal component of a digital broadcast is present in a channel region adjacent to the lower sideband of that channel, then its lower sideband second component $DSU_{q-2}$ is included in the frequency range $(f_q-10\text{ kHz})\sim(f_q-5\text{ kHz})$, and its lower sideband first component $DPU_{q-2}$ is included in the frequency range $(f_q-15\text{ kHz})\sim(f_q-10\text{ kHz})$. On the other hand, if a signal component of a digital broadcast is present in a channel region adjacent to the upper sideband of that channel, then its upper sideband second component $DSL_{q+2}$ is included in the frequency range $(f_q+5\text{ kHz})\sim(f_q+10\text{ kHz})$, and its upper sideband first component $DPL_{q+2}$ is included in the frequency range $(f_q+10\text{ kHz})\sim(f_q+15\text{ kHz})$.

Returning to FIG. 1, the control unit 120A controls the overall operation of the broadcast receiving device 100A. This control unit 120A will be described hereinafter.

Figure 3:
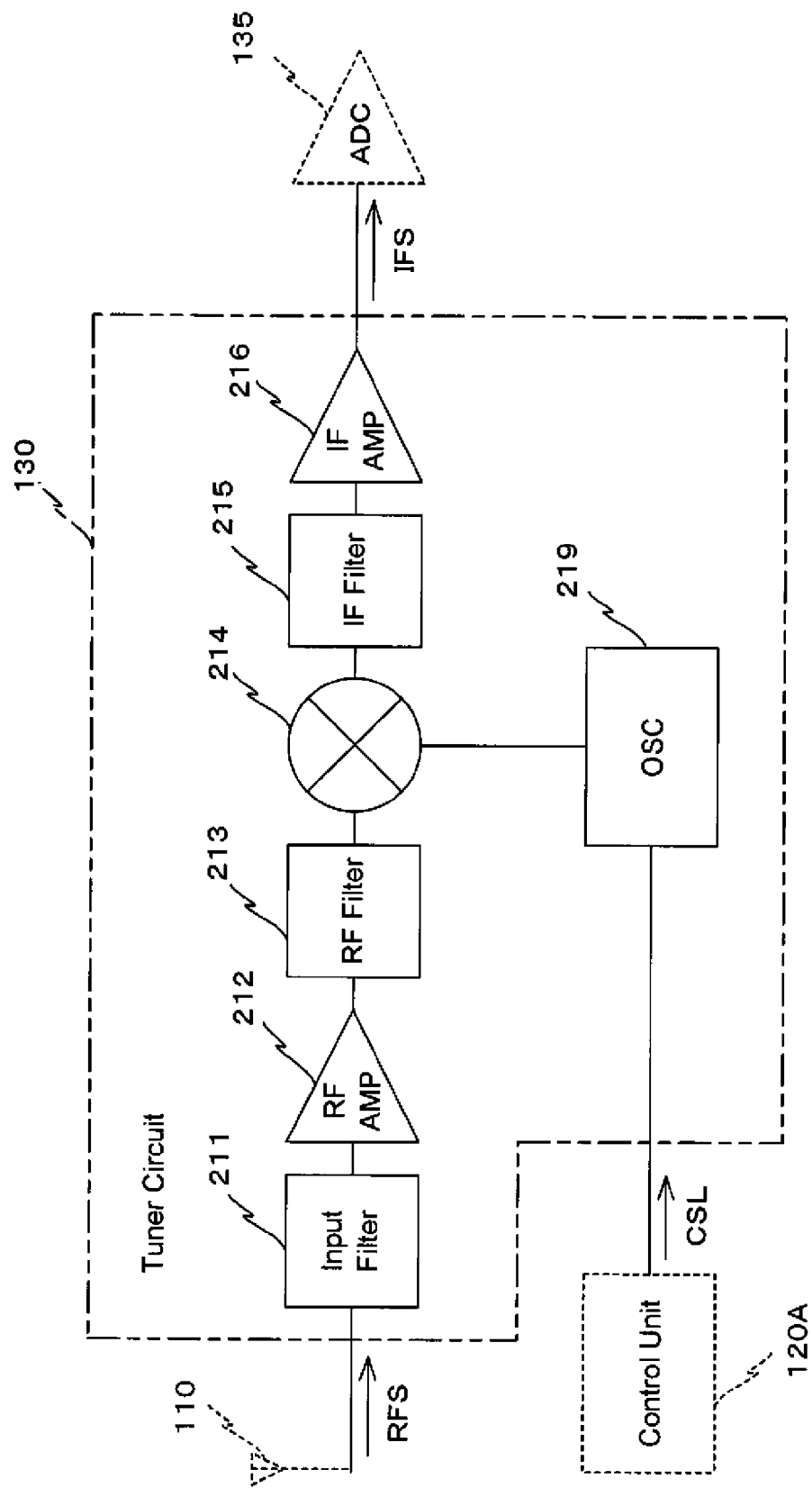
FIG. 3 is a block diagram showing the structure of a tuner unit of FIG. 1.

The tuner unit 130 performs tuning processing according to a tuning command CSL from the control unit 120A, and outputs a tuning signal IFS having a predetermined intermediate frequency to the ADC 135. As shown in FIG. 3, this tuner unit 130 comprises an input filter 211, a high frequency amplifier (RF-AMP: Radio Frequency Amplifier) 212, and a band pass filter 213 (hereinafter also sometimes termed an "RF filter"). Moreover, this tuner unit 130 comprises a mixer (mixing device) 214, an intermediate frequency filter 215 (hereinafter also sometimes termed an "IF filter"), and an intermediate frequency amplifier (IF-AMP: Intermediate Frequency Amplifier) 216. Yet further, the tuner unit 130 further comprises a local oscillation circuit (OSC) 219.

The input filter 211 is a high pass filter which intercepts low frequency components of the received signal RFS from the antenna 110. And the high frequency amplifier 212 amplifies the signal which passes through this input filter 211.

The RF filter 213 selectively passes signals of a specified frequency range in the signal outputted from the high frequency amplifier 212. The mixer 214 mixes together the signal passed through the RF filter 213 and a local oscillation signal which is supplied by the local oscillation circuit 219. And, from the signal outputted from the mixer 214, the IF filter 215 selects and passes through a signal in a predetermined intermediate frequency range (of frequency width about 40 kHz).

The intermediate frequency amplifier 216 amplifies the signal passed through by the IF filter 215. The result of this amplification by the intermediate frequency amplifier 216 is supplied to the ADC 135 as the tuning signal IFS.

The local oscillation circuit 219 includes an oscillator etc., and its oscillation frequency can be controlled by voltage control or the like. According to the tuning command CSL supplied from the control unit 120A, this local oscillation circuit 219 generates a local oscillation signal of a frequency corresponding to the channel to be tuned to by the tuner unit 130, and supplies this signal to the mixer 214.

Returning to FIG. 1, the ADC 135 receives the tuning signal IFS, which is an analog signal. And the ADC 135 converts this tuning signal IFS into a digital signal. The result of this conversion is then sent to the reproduction processing unit 140A as a digital tuning signal IFD.

Figure 4:
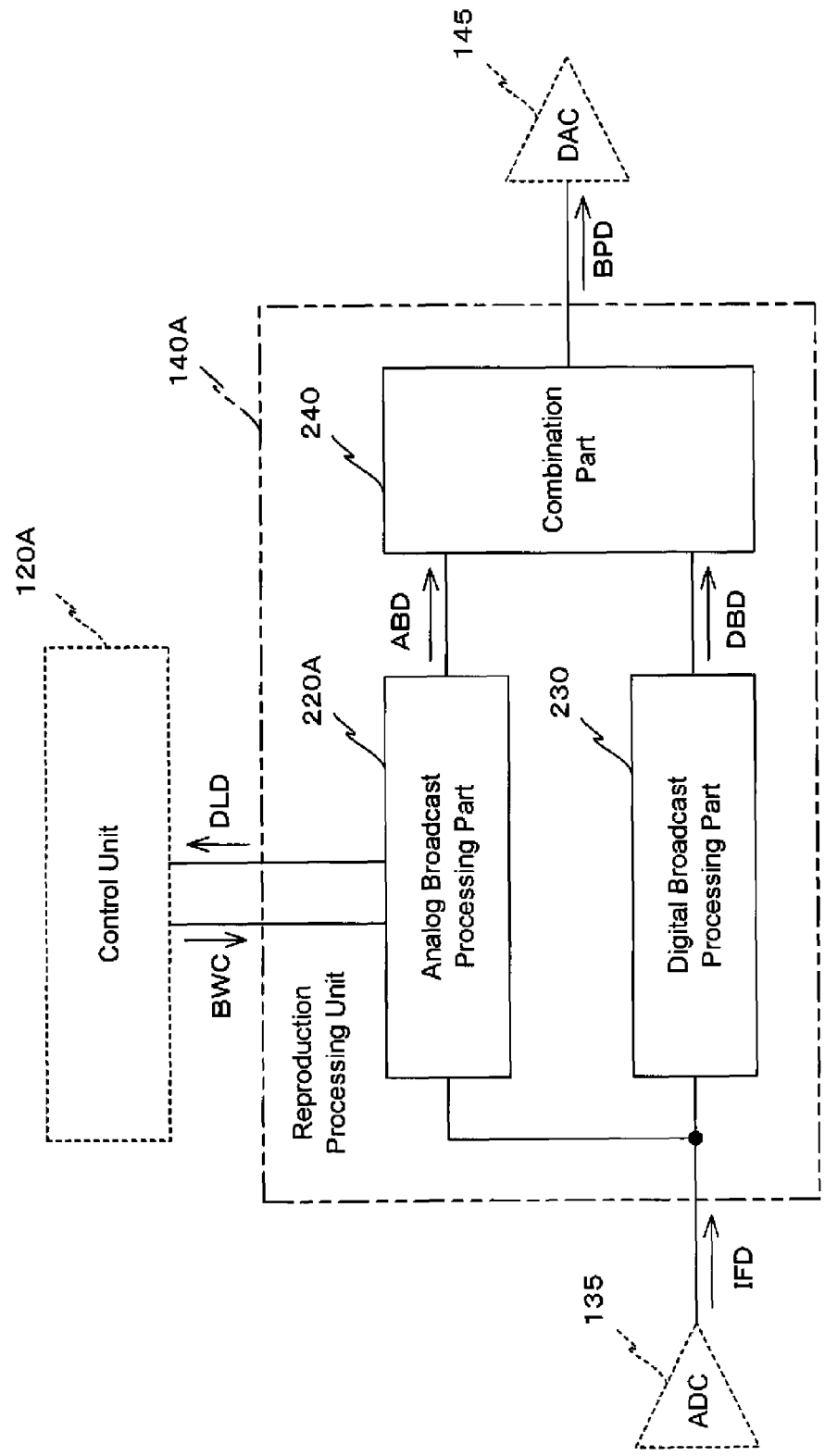
FIG. 4 is the block diagram showing the structure of a reproduction processing unit of FIG. 1.

Under control by the control unit 120A, the reproduction processing unit 140A processes the digital tuning signal IFD from the ADC 135, and generates a processed broadcast signal BPD. And, as shown in FIG. 4, this reproduction processing unit 140A is provided with an analog broadcast processing part 220A, a digital broadcast processing part 230, and a combination part 240.

Figure 5:
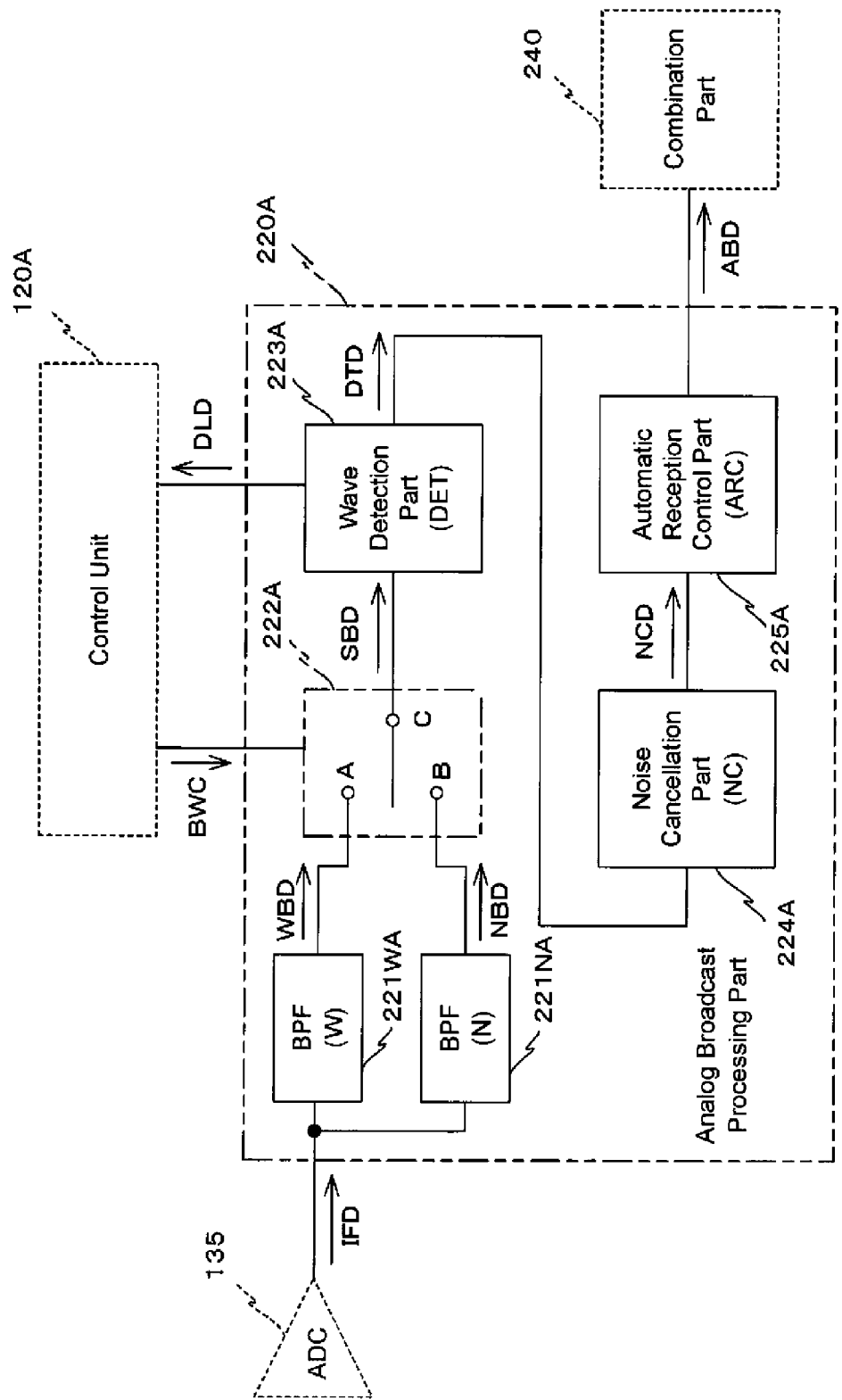
FIG. 5 is the block diagram showing the structure of an analog broadcast processing part of FIG. 4.

The analog broadcast processing part 220A processes the digital tuning signal from the ADC 135, and generates a processed analog broadcast signal ABD. As shown in FIG. 5, this analog broadcast processing part 220A comprises a band pass filter part (BPF) 221WA which serves as the first filter means, a band pass filter part (BPF) 221NA which serves as the second filter means, and a switch part 222A. Moreover, this analog broadcast processing part 220A also comprises a wave detection part 223A (DET) which serves as the first detection means and the second detection means, a noise cancellation part 224A (NC), and an automatic reception control part 225A (ARC).

The BPF 221WA receives the digital tuning signal IFD from the ADC 135. And, when analog broadcasting is being performed using a channel corresponding to a tuning command CSL, the BPF 221WA selectively passes through signal components in a predetermined frequency range necessary for reproduction of that analog broadcast. Here, if the center frequency in the digital tuning signal IFD of the channel corresponding to the tuning command CSL is taken as $F_j$, then the frequency range of the signal passed through by the BPF 221WA is within the frequency range $(F_j-5\,kHz)\sim(F_j+5\,kHz)$, and has the first predetermined frequency range centered at the frequency $F_j$ and sufficiently broader than the above described frequency width $\Delta F$. The signal passed through the BPF 221WA is taken as a signal WBD, and is supplied to the switch part 222A.

It should be understood that this first predetermined frequency range is determined in advance on the basis of experiment, simulation, experience, and so on.

The BPF 221NA receives the digital tuning signal IFD from the ADC 135. The BPF 221NA passes through signal components in a second predetermined frequency range, whose frequency width is centered at the frequency $F_j$ and is sufficiently narrower than the above described first predetermined frequency width. The signal passed through the BPF 221NA is taken as a signal NBD, and is supplied to the switch part 222A.

It should be understood that this second predetermined frequency range is also determined in advance on the basis of experiment, simulation, experience, and so on.

At its A terminal, the switch part 222A receives the signal WBD from the BPF 221WA. Moreover, at its B terminal, the switch part 222A receives the signal NBD from the BPF 221NA. And, according to the bandwidth selection command BWC from the control unit 120A, the switch part 222A selects either the signal WBD or the signal NBD, and outputs the signal SBD from its C terminal.

The wave detection unit 223A receives the signal SBD from the switch part 222A. And the wave detection part 223A performs wave detection processing upon the signal SBD by some predetermined method. The result of this wave detection is outputted to the noise cancellation part 224A as a wave detection signal DTD.

It should be understood that the wave detection part 223A is endowed with a so called S-meter function of detecting the power level of the signal SBD. The signal power level which it detects by using this S-meter function is reported to the control unit 120A as a level detection result DLD.

The noise cancellation part 224A receives the wave detection signal DTD from the wave detection part 223A. And the noise cancellation part 224A eliminates high frequency noise and so on which is superposed upon the wave detection signal DTD, thus generation a noise cancelled signal NCD. This noise cancelled signal NCD is sent to the automatic reception control part 225A.

The automatic reception control part 225A receives the noise cancelled signal NCD from the noise cancellation part 224A. And this automatic reception control part 225A estimates the state of fluctuation of the radio waves on the basis of the noise cancelled signal NCD, and performs auto high cut processing and/or shift muting processing according to the result of this estimation. The result of this processing by the automatic reception control part 225A is sent to the combination part 240 as the processed analog broadcast signal ABD.

Returning to FIG. 4, the digital broadcast processing part 230 processes the digital tuning signal IFD from the ADC 135, and generates a processed digital broadcast signal DBD.

Figure 6:
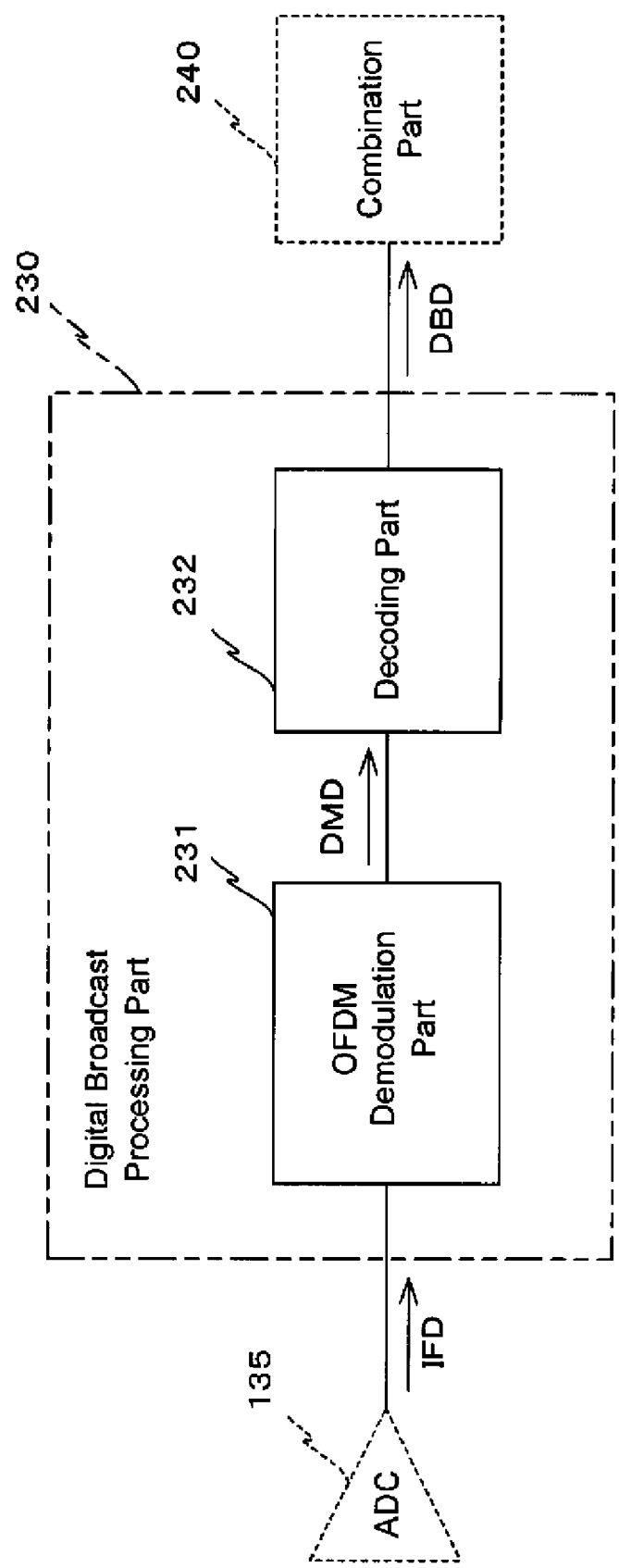
FIG. 6 is the block diagram showing the structure of a digital broadcast processing part of FIG. 4.

As shown in FIG. 6, this digital broadcast processing part 230 comprises an OFDM demodulation part 231 and a decoding part 232.

The OFDM demodulation part 231 performs OFDM demodulation processing on the basis of the digital tuning signal IFD. The result of this demodulation by the OFDM demodulation part 231 is sent to the decoding part 232 as a demodulated signal DMD.

The decoding part 232 receives the demodulated signal DMD from the OFDM demodulation part 231. And the decoding part 232 performs decoding of this demodulated signal DMD. The result of this decoding is sent to the combination part 240 as the processed digital broadcast signal DBD.

Returning to FIG. 4, the combination part 240 receives the processed analog broadcast signal ABD from the analog broadcast processing part 220A and the processed digital broadcast signal DBD from the digital broadcast processing part 230. And the combination part 240 performs combination of this processed analog broadcast signal ABD and this processed digital broadcast signal DBD. The result of this combination is sent to the DAC 145 as the processed broadcast signal BPD.

Although this feature is not shown in the figures, the signal combination by the combination part 240 is performed under control by the control unit 120A. For example, the control unit 120A determines the ratio for combination on the basis of the level detection result DLD, and commands the combination part 240 to employ this combination ratio which has been determined.

Returning to FIG. 1, the DAC 145 receives the processed broadcast signal BPD, which is a digital signal. And the DAC 145 converts this processed broadcast signal BPD into an analog signal. The result of this conversion is sent to the audio volume adjustment unit 150 as a signal BPS.

The audio volume adjustment unit 150 is endowed with the function of a so called electronic volume control. This audio volume adjustment unit 150 receives the signal BPS from the DAC 145. And the audio volume adjustment unit 150 performs processing to amplify or to attenuate the signal BPS, according to an audio volume adjustment setting VLC from the control unit 120A. The result of this processing is sent to the power amplifier 155 as a volume adjusted audio signal VCS.

The power amplifier 155 receives the volume adjusted audio signal VCS from the audio volume adjustment unit 150. And the power amplifier 155 performs power amplification of the volume adjusted audio signal VCS. The result of this amplification is sent to the speaker 160 as an audio output signal AOS.

The speaker 160 receives the audio output signal AOS from the power amplifier 155. And the speaker 160 reproduces and outputs audio corresponding to the audio output signal AOS.

The actuation input unit 170 consists of a key section which is provided in the main body portion of the broadcast receiving device 100A, or of a remote input device which includes such a key section or the like. Here, a touch panel which is provided upon the display unit 180 may be used as this key section provided to the main body portion. Moreover, instead of a structure which includes a key section, a structure which inputs audio may also be employed. The result of actuation input to the actuation input unit 170 is sent to the control unit 120A as actuation input data IPD.

The display unit 180 comprises: (i) a display device such as a liquid crystal display panel, an organic EL (Electro Luminescence) panel, a PDP (Plasma Display Panel), or the like; and (ii) a display control circuit which displays an image upon that display device, according to image data IDT received from the control unit 120A. Actuation guidance and the state of the broadcast receiving device 100A are displayed upon this display unit 180.

Figure 7:
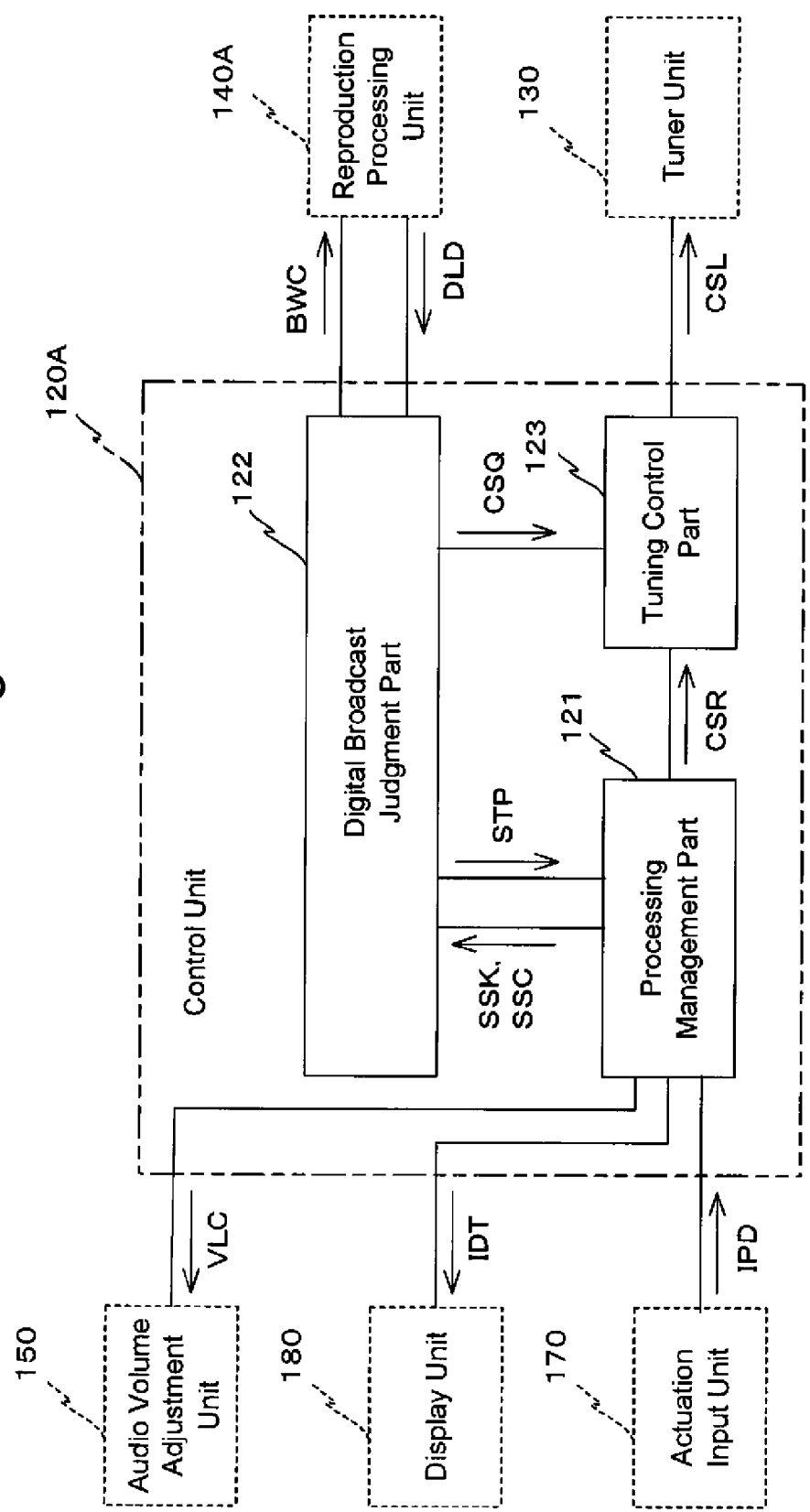
FIG. 7 is the block diagram showing the structure of a control unit of FIG. 1.

Returning to FIG. 1, as described above, the control unit 120A controls the overall operation of this broadcast receiving device 100A. As shown in FIG. 7, this control unit 120A comprises a processing management part 121, a digital broadcast judgment part 122 which serves as a judgment means and a digital broadcast scan means, and a tuning control part 123 which serves as a tuning control means.

The processing management part 121 performs control of the operation of this broadcast receiving device 100A, according to operation commands inputted to the actuation input unit 170. In other words, when it is reported from the actuation input unit 170 that a tuning command which designates some specific station has been inputted, then the processing management part 121 sends to the tuning control part 123 a tuning request CSR designating this specific station to be selected. Moreover, when it is reported from the actuation input unit 170 that an audio volume setting has been inputted, then the processing management part 121 sends to the audio volume adjustment unit 150 the audio volume adjustment setting VLC which corresponds to the designated audio volume. Moreover, the processing management part 121 sends to the display unit 180 image data IDT for displaying actuation guidance and/or the state of the broadcast receiving device 100A.

Furthermore, when it is reported that an input has arrived from the actuation input unit 170 to the effect that scanning is to be performed for a channel upon which a hybrid broadcast including a digital broadcast is being performed, then the processing management part 121 sends a digital broadcast scan command to the digital broadcast judgment part 122. Here, when it is reported that an input has arrived from the actuation input unit 170 to the effect that searching is to be performed in a scan direction for the closest hybrid broadcast channel to the channel which is currently being listened to, then the processing management part 122 sends a digital broadcast seek command SSK to the digital broadcast judgment part 122. Moreover, when it is reported that an input has arrived from the actuation input unit 170 to the effect that information must be collected for all hybrid broadcast channels in a frequency range which is set in advance, then the processing management part 122 sends an all range digital broadcast scan command SSC to the digital broadcast judgment part 122.

It should be understood that, in this first embodiment, the processing management part 121 sets a start channel and an end channel related to scanning, in the case of both the seek command SSK and the all range scan command SSC. Moreover, after having issued a seek command SSK or an all range scan command SSC, until the scan operation by the digital broadcast judgment part 122 ends, the processing management part 121 sets the audio volume to 0 (i.e. to the mute state) with the audio volume adjustment setting VLC.

Upon receipt of a seek command SSK or an all range scan command SSC from the processing management part 121, the digital broadcast judgment part 122 starts scanning for a digital broadcast. During this scanning for a digital broadcast, the digital broadcast judgment part 122 sequentially sends to the tuning control part 123 tuning requests CSQ in which channels to be selected are designated. And, each time a channel is selected according to such a tuning request CSQ, the digital broadcast judgment part 122 changes over the signal selection by the switch part 222A, using a bandwidth selection command BWC.

While controlling this change over of signal selection, the digital broadcast judgment part 122 collects the value $V_W$ of the level detection result DLD if the signal WBD is selected, and collects the value $V_N$ of the level detection result DLD if the signal NBD has been selected. And a judgment is made as to whether or not this is a channel upon which hybrid broadcasting is being performed, on the basis of the result of this collection of the values $V_W$ and $V_N$.

When a digital broadcast scan operation ends, the digital broadcast judgment part 122 reports this fact to the processing management part 121 as a scan end report STP. Here, in the case of an end report for the seek command SSK, the digital broadcast judgment part 122 reports to the processing management part 121 information as to the hybrid broadcast channel which is closest in the scan direction to the channel which is currently being listened to. Furthermore, in the case of an end report for the all range scan command SSC, the digital broadcast judgment part 122 reports to the processing management part 121 information as to the entire hybrid broadcast channels which have been found in the entire frequency range set in advance.

The tuning control part 123 receives these tuning requests CSR from the processing management part 121 and these tuning requests CSQ from the digital broadcast judgment part 122. And, each time it receives a tuning request CSR or a tuning request CSQ, the tuning control part 123 sends a tuning command CSL corresponding to this received tuning request to the tuner unit 130.

[Operation]

The operation of this broadcast receiving device 100A having a structure as described above will now be explained with particular attention being paid to search processing performed by the digital broadcast judgment part 122, for finding a digital broadcast in a hybrid broadcast in which both analog broadcasting and digital broadcasting are being performed.

<<Seek Operation>>

First, the processing to seek for a digital broadcast in a hybrid broadcast will be explained.

This seek processing starts by the processing management part 121, to which it has been reported that an input has arrived from the actuation input unit 170 to the effect that seeking should be performed in the scan direction for the hybrid broadcast channel closest to the channel which is currently being listened to, sending a seek command SSK to the digital broadcast judgment part 122. It should be understood that, as described above, it is arranged for a seek start channel and a seek end channel to be designated in the above seek command SSK.

Figure 8:
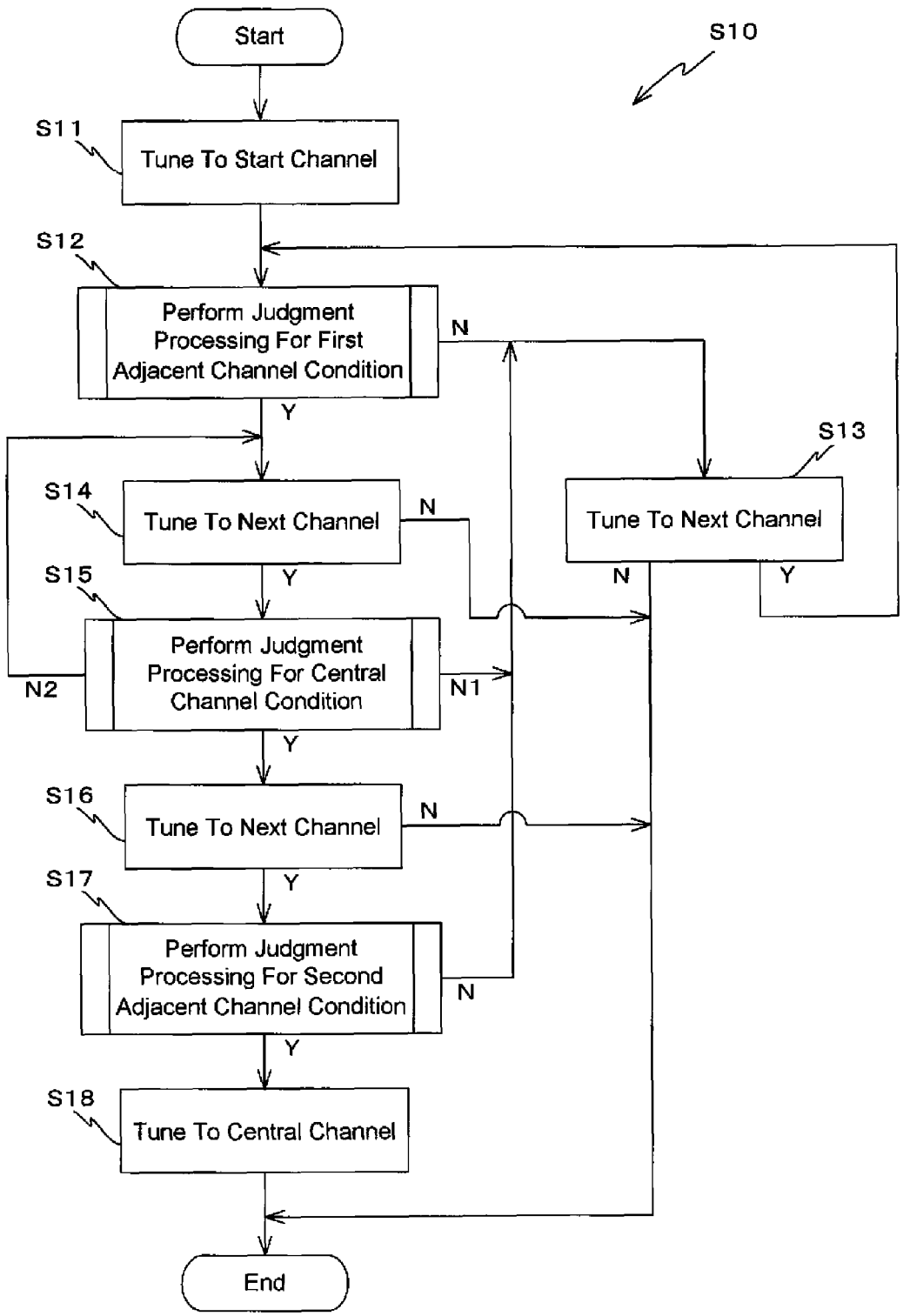
FIG. 8 is a flow chart for explanation of seek processing for a hybrid broadcast by the device of FIG. 1.
Figure 9:
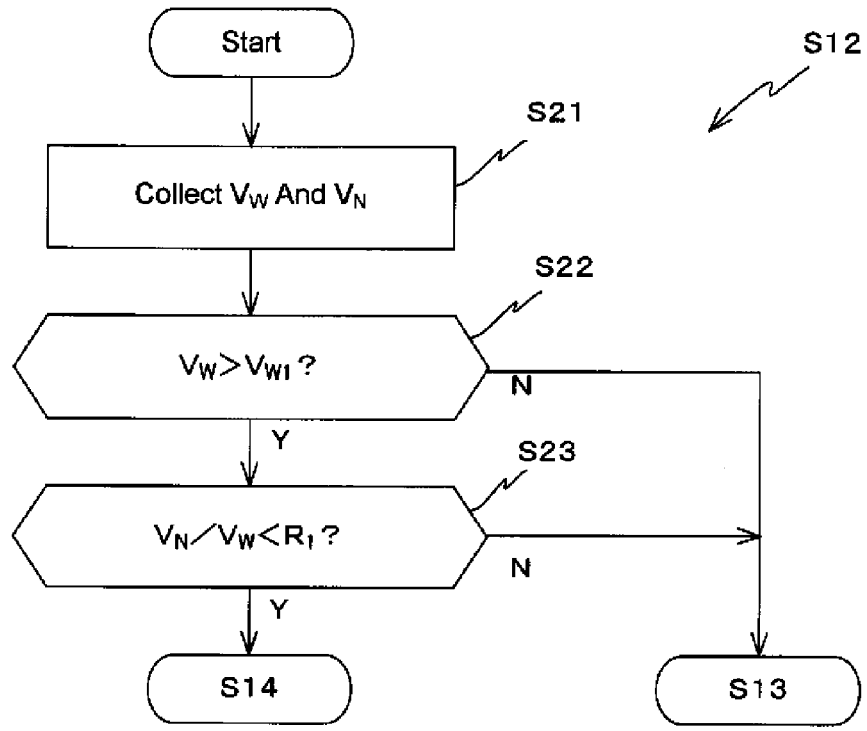
FIG. 9 is the flow chart for explanation of processing in FIG. 8 for judging upon the first adjacent channel condition.

As shown in FIG. 8, in this seek processing S10, first, in a step S11, the digital broadcast judgment part 122 sends to the tuning control part 123 a tuning request CSQ to the effect that the start channel is to be selected. Upon receipt of this tuning request CSQ, the tuning control part 123 sends to the tuner unit 130 a tuning command CSL corresponding to the start channel. As a result, a tuning signal IFS, which is the intermediate frequency signal corresponding to the start channel, is extracted by the tuner unit 130. And, after this tuning signal IFS has been converted to digital form by the ADC 135, the digital tuning signal IFD which is the result of this conversion is supplied to the reproduction processing unit 140A.

Next, in a step S12, the digital broadcast judgment part 122 performs judgment processing for a first adjacent channel condition, which is a capability for estimating whether the channel which has been tuned includes only a digital broadcast component. In this judgment processing for the first adjacent channel condition of the step S12, as shown in FIG.

9, first, in a step S21, the digital broadcast judgment part 122 collects the values $V_W$ and $V_N$.

When collecting these values $V_W$ and $V_N$, the digital broadcast judgment part 122 first sends a bandwidth control command BWC to the switch part 222A for the signal WBD to be selected. As a result, the signal level $V_W$ of the signal WBD is detected by the S-meter function of the wave detection part 223A, and is reported to the digital broadcast judgment part 122 as the level detection result DLD. This is the manner in which the digital broadcast judgment part 122 acquires the reported value $V_W$.

Next, the digital broadcast judgment part 122 sends a bandwidth control command BWC to the switch part 222A for the signal NBD to be selected. As a result, the signal level $V_N$ of the signal NBD is detected by the S-meter function of the wave detection part 223A, and is reported to the digital broadcast judgment part 122 as the level detection result DLD. This is the manner in which the digital broadcast judgment part 122 acquires the reported value $V_N$.

When the collection of the values $V_W$ and $V_N$ in this manner has been completed, the flow of control proceeds to a step S22. In this step S22, by making a judgment as to whether or not the value $V_W$ is larger than some predetermined value $V_{W1}$, the digital broadcast judgment part 122 makes a judgment as to whether or not it is possible to infer that an analog broadcast component or a digital broadcast component is present in the bandwidth of the channel which is selected. If the result of this judgment is negative (N in the step S22), then it is considered that the first adjacent channel condition is not satisfied, and the flow of control is transferred to a step S13. It should be understood that this predetermined value $V_{W1}$ is determined in advance by experiment, simulation, experience, or the like.

If the result of the judgment in this step S22 is affirmative (Y in the step S22), then the flow of control proceeds to a step S23. In this step S23, by making a judgment as to whether or not the value ($V_N/V_W$) is smaller than some predetermined value $R_1$, the digital broadcast judgment part 122 makes a judgment as to whether or not it is possible to infer that the signal component included in the bandwidth of the channel which is selected is only a digital broadcast component. It should be understood that this predetermined value $R_1$ is determined in advance by experiment, simulation, experience, or the like.

If the result of this judgment in the step S23 is negative (N in the step S23), then it is considered that the first adjacent channel condition is not satisfied, and the flow of control is transferred to the step S13. On the other hand, if the result of this judgment in the step S23 is affirmative (Y in the step S23), then it is considered that the first adjacent channel condition is satisfied, and the flow of control is transferred to a step S14.

Figure 10:
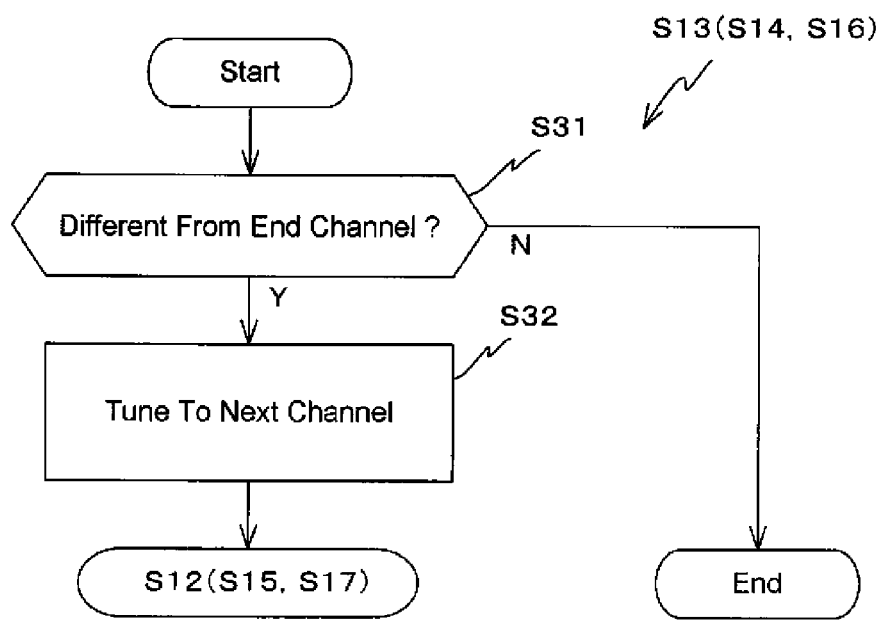
FIG. 10 is the flow chart for explanation of processing in FIG. 8 for next channel tuning processing.

Returning to FIG. 8, if in the step S12 it is judged that the first adjacent channel condition is not satisfied (N in the step S12) and the flow of control is transferred to the step S13, and then tuning processing for the next channel is performed. For this tuning processing to the next channel of the step S13, as shown in FIG. 10, first, the digital broadcast judgment part 122 makes a judgment as to whether or not the currently selected channel is a different channel from the end channel which was designated in the seek command SSK. If the result of this judgment is negative (N in the step S31), then, as a scan end report STP, the digital broadcast judgment part 122 reports to the processing management part 121 the fact that no channel has been found on which hybrid broadcasting is being performed, and then the processing of this step S10 terminates.

If the result of the judgment in the step S31 is affirmative (Y in the step S31), then the flow of control proceeds to a step S32. In this step S32, the digital broadcast judgment part 122 sends to the tuning control part 123 a tuning request CSQ to the effect that the next channel to the channel which is currently selected should be selected. As a result, a tuning command CSL corresponding to that next channel is sent to the tuner unit 130 by the tuning control part 123, and a digital tuning signal IFD corresponding to that next channel is supplied to the reproduction processing unit 140A. Subsequently, the flow of control returns to the step S12.

Returning to FIG. 8, if in the step S12 it is judged that the first adjacent channel condition is satisfied (Y in the step S12), then the flow of control is transferred to the step S14, in which tuning processing for the next channel is performed. For this tuning processing to the next channel of the step S14, as shown in FIG. 10, after tuning to the next channel, similar processing to that of the step S13 described above is performed, except for the fact that the flow of control proceeds to a step S15.

Figure 11:
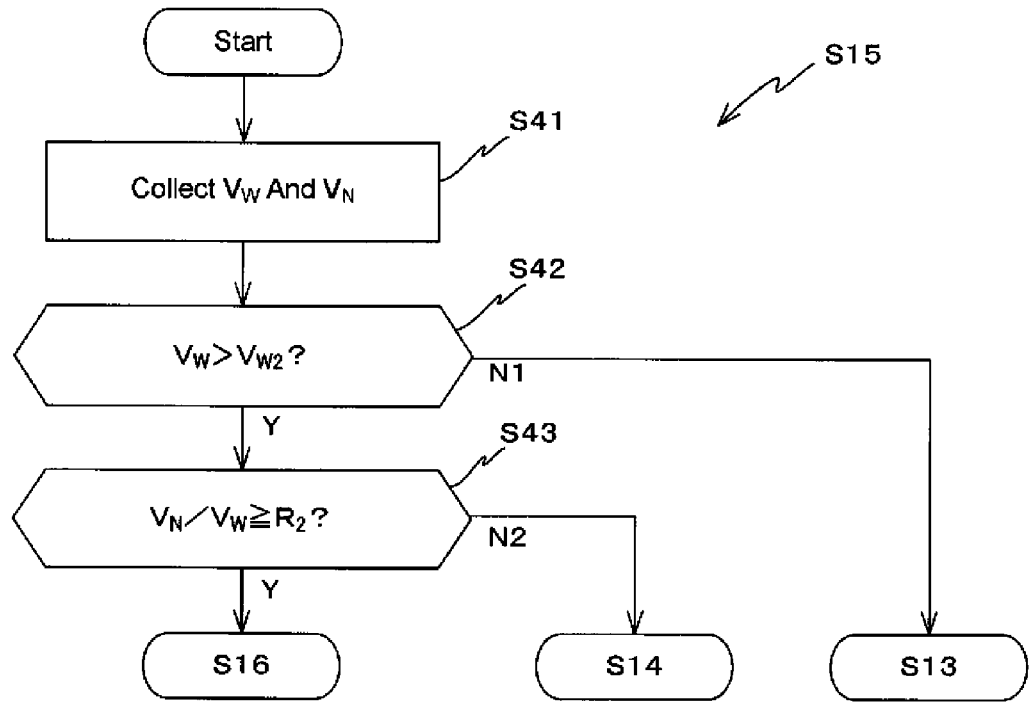
FIG. 11 is the flow chart for explanation of processing in FIG. 8 for judging upon a central channel condition.

Returning to FIG. 8, when tuning is performed in the step S14 to the next channel and the flow of control proceeds to the step S15, then the digital broadcast judgment part 122 performs judgment processing for a central channel condition, i.e. whether or not it is possible to infer that the channel which has been tuned to includes both an analog broadcast component and also a digital broadcast component. In this judgment processing of the step S15 for this central channel condition, as shown in FIG. 11, first, in a step S41, in a similar manner to the case in the step S21 described above, the digital broadcast judgment part 122 collects the values $V_W$ and $V_N$.

Next, in a step S42, by making a judgment as to whether or not the value $V_W$ is larger than some predetermined value $V_{W2}$, the digital broadcast judgment part 122 makes a judgment as to whether or not it is possible to infer that an analog broadcast signal component or a digital broadcast component is present in the bandwidth of the channel which is selected. If the result of this judgment is negative (N1 in the step S42), then, along with it being considered that the center channel condition is not satisfied, also it is considered that the above described first adjacent channel condition is not satisfied, and the flow of control is transferred to the step S13. It should be understood that this predetermined value $V_{W2}$ is determined in advance by experiment, simulation, experience, or the like.

If the result of the judgment in this step S42 is affirmative (Y in the step S42), then the flow of control proceeds to a step S43. In this step S43, by making a judgment as to whether or not the value ($V_N/V_W$) is greater than or equal to some predetermined value $R_2$, the digital broadcast judgment part 122 makes a judgment as to whether or not it is possible to infer that an analog broadcast component and a digital broadcast component are included in the bandwidth of the channel which is selected. It should be understood that this predetermined value $R_2$ is determined in advance by experiment, simulation, experience, or the like.

If the result of this judgment in the step S43 is negative (N2 in the step S43), then it is considered that, although the central channel condition is not satisfied, still the first adjacent channel condition is satisfied, and the flow of control returns to the step S14. On the other hand, if the result of this judgment in the step S43 is affirmative (Y in the step S43), then it is considered that the central channel condition is satisfied, and the flow of control is transferred to a step S16.

Returning to FIG. 8, in the step S15, if it is judged that the central channel condition is satisfied (Y in the step S15), and then the flow of control is transferred to the step S16, in which processing for tuning to the next channel is performed. For this tuning processing to the next channel of the step S16, as shown in FIG. 10, after tuning to the next channel, similar processing to that of the step S13 described above is performed, except for the fact that the flow of control proceeds to the step S17.

Figure 12:
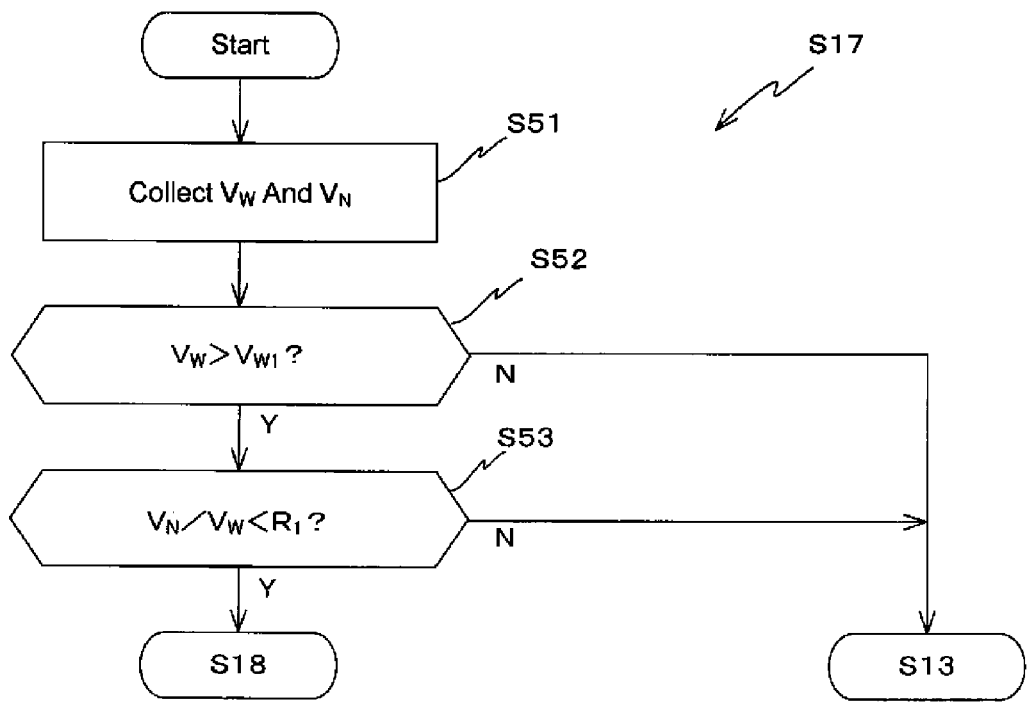
FIG. 12 is the flow chart for explanation of processing in FIG. 8 for judging upon a second adjacent channel condition.

Returning to FIG. 8, in the step S16 tuning to the next channel is performed, and then the flow of control proceeds to a step S17, in which the digital broadcast judgment part 122 performs judgment processing of the second adjacent channel condition as to whether or not it is possible to infer that only a digital broadcast component is included in the bandwidth of the channel which is tuned. In this judgment processing of the step S17 for the second adjacent channel condition, as shown in FIG. 12, first, in a step S51, in a similar manner to the case in the step S21 described above, the digital broadcast judgment part 122 collects the values $V_W$ and $V_N$.

Next, in the step S52, by making a judgment as to whether or not the value $V_W$ is larger than some predetermined value $V_{W1}$, the digital broadcast judgment part 122 makes a judgment as to whether or not it is possible to infer that an analog broadcast signal component or a digital broadcast component is present in the bandwidth of the channel which is selected. If the result of this judgment is negative (N in the step S52), then it is considered that the second adjacent channel condition is not satisfied, and the flow of control is transferred to the step S13.

If the result of the judgment in this step S52 is affirmative (Y in the step S52), then the flow of control proceeds to a step S53. In this step S53, by making a judgment as to whether or not the value $(V_N/V_W)$ is smaller than some predetermined value $R_1$, the digital broadcast judgment part 122 makes a judgment as to whether or not it is possible to infer that the signal component included in the bandwidth of the channel which is selected is a digital broadcast component.

If the result of this judgment in the step S53 is negative (N in the step S53), then it is considered that the second adjacent channel condition is not satisfied, and the flow of control is transferred to the step S13. On the other hand, if the result of this judgment in the step S53 is affirmative (Y in the step S53), then it is considered that the second adjacent channel condition is satisfied, and the flow of control is transferred to a step S18.

Returning to FIG. 8, in the step S18, the digital broadcast judgment part 122 reports to the processing management part 121, as a scan end report STP, information about the channel for which, in the step S15 described above, it was judged that the central channel condition was satisfied, in other words frequency information for the central channel which corresponds to the channel upon which hybrid broadcasting is being performed. Then, the seek processing of this step S10 terminates.

Upon receipt of this information about the central channel which has been found by the seek processing, the processing management part 121 sends to the tuning control part 123 a tuning request CSR to the effect that this central channel is to be selected. And, upon receipt of this tuning request CSR, the tuning control part 123 sends to the tuner unit 130 a tuning command CSL corresponding to this central channel. As a result, a tuning signal IFS, which is the intermediate frequency signal corresponding to the start channel, is extracted by the tuner unit 130. And, after this tuning signal IFS has been converted to digital form by the ADC 135, the digital tuning signal IFD which is the result of this conversion is supplied to the reproduction processing unit 140A. And signal processing is sequentially performed by the reproduction processing unit 140A, the DAC 145, the audio volume adjustment unit 150, and the power amplifier 155, and thereby the audio of the hybrid broadcast which has been found is reproduced and outputted from the speaker 160.

<<All Range Scan Operation>>

Next, the all range scan processing for digital broadcasts in hybrid broadcasts will be explained.

This all range scan processing is started by the processing management part 121, to which it has been reported that information about hybrid broadcast channels is to be collected for an entire range of frequencies set in advance, sending an all range scan command SSC to the digital broadcast judgment part 122. It should be understood that, as described above, a start channel for scanning and an end channel are designated by this all range scan command SSC.

Figure 13:
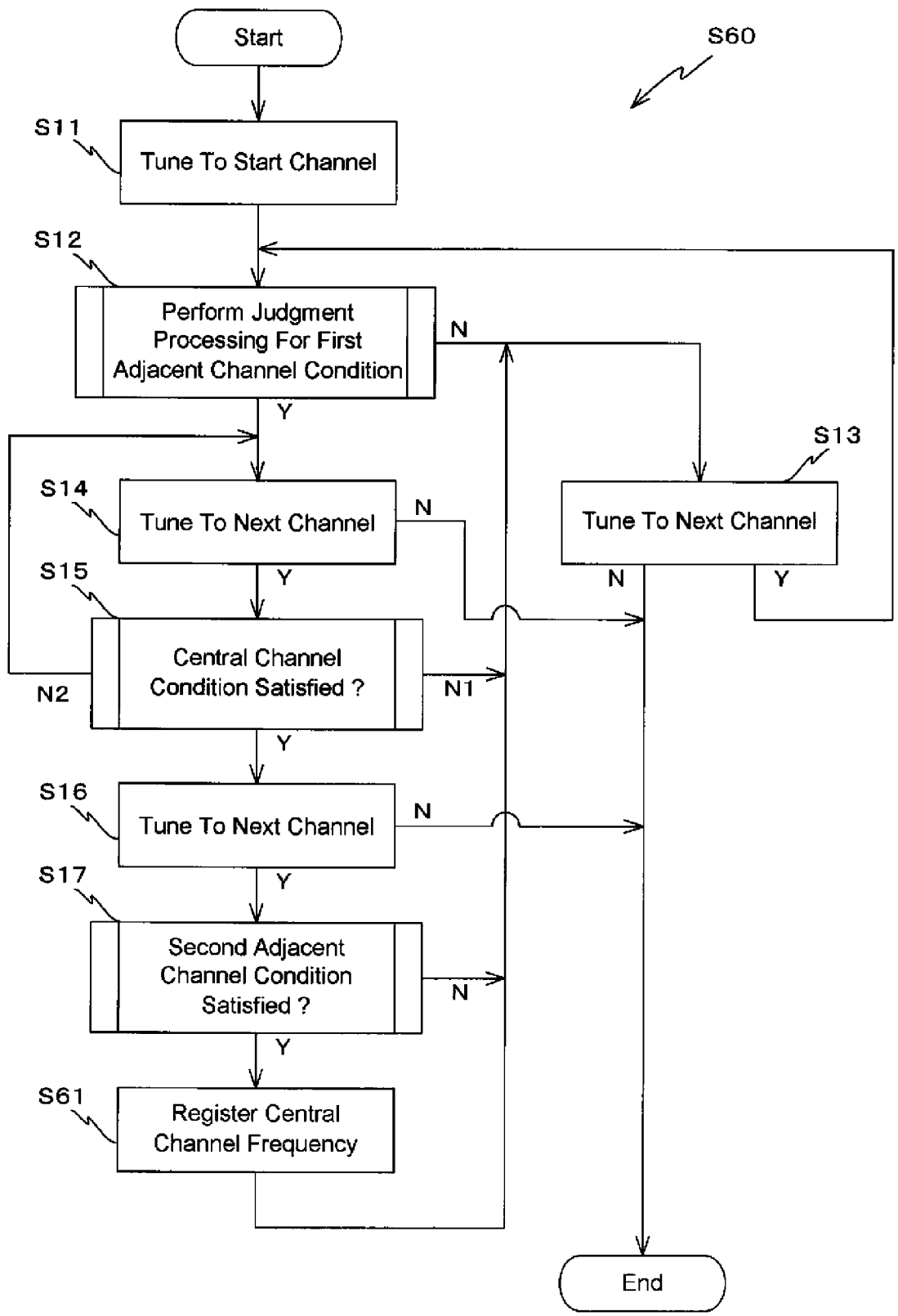
FIG. 13 is the flow chart for explanation of hybrid broadcast all range scanning processing performed by the device of FIG. 1.

As shown in FIG. 13, in this all range scan processing S60, processing of steps S11 through S17 is executed in a similar manner to the case of the seek processing described above. It should be understood that, in the steps S13, S14, and S16, when it has been judged that the all range scan processing S60 should end, information related to all of the hybrid broadcasts which have been found by this all range scan is reported to the processing management part 121 as a scan end report STP; and in this regard, this processing differs from the seek processing S10.

Furthermore, in this all range scan processing S60, if in the step S17 it has been judged that the second adjacent channel condition is satisfied, then in a step S61, instead of the step S18 in the case of the seek processing S10, it is arranged for information about the central channel of the hybrid broadcast which has been found is stored in the digital broadcast judgment part 122. And, after the processing of the step S61, the flow of control returns to the step S13.

Upon receipt of this information about the channels which are being utilized for hybrid broadcast found by the all range scan processing, the processing management part 121 applies this information for display of actuation guidance or the like. As a result, the convenience for the user is enhanced.

As has been explained above, in this first embodiment, the search for hybrid broadcasts according to the IBOC system is conducted by, while sequentially changing the selected channel, collecting the signal level value $V_W$ of the signal extracted on wide band, i.e. of the so called WBD signal, which is a signal of bandwidth appropriate for reproduction of an analog broadcast, and the signal level value $V_N$ of the signal NBD extracted on narrow band, which is a signal of bandwidth around ΔF for which, in the case of the IBOC system, there is a possibility that neither a digital broadcast component nor an analog broadcast component is present. And the search for channels upon which hybrid broadcasting is being performed is conducted by deciding, only on the basis of these signal level values $V_W$ and $V_N$, for three consecutive channels, whether or not the first adjacent channel condition, the central channel condition, and the second adjacent channel condition are sequentially satisfied.

Accordingly, since it is possible to perform this operation without analyzing the received contents and checking whether a digital broadcast is included therein, it is possible, when receiving a radio broadcast according to the IBOC system, promptly to decide whether or not a digital broadcast is included therein.

The Second Embodiment

Figure 15:
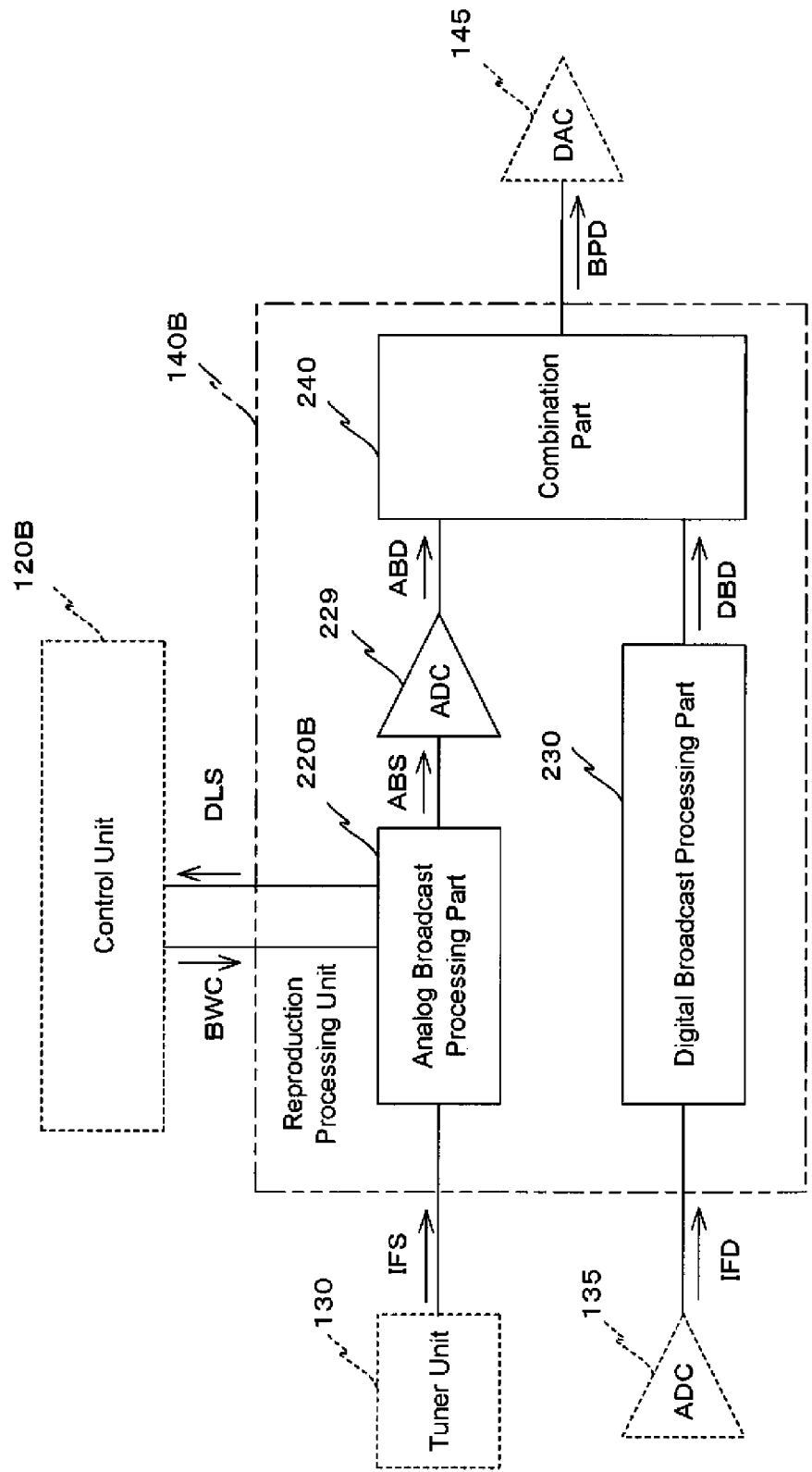
FIG. 15 is the block diagram showing the structure of a reproduction processing unit of FIG. 14.
Figure 16:
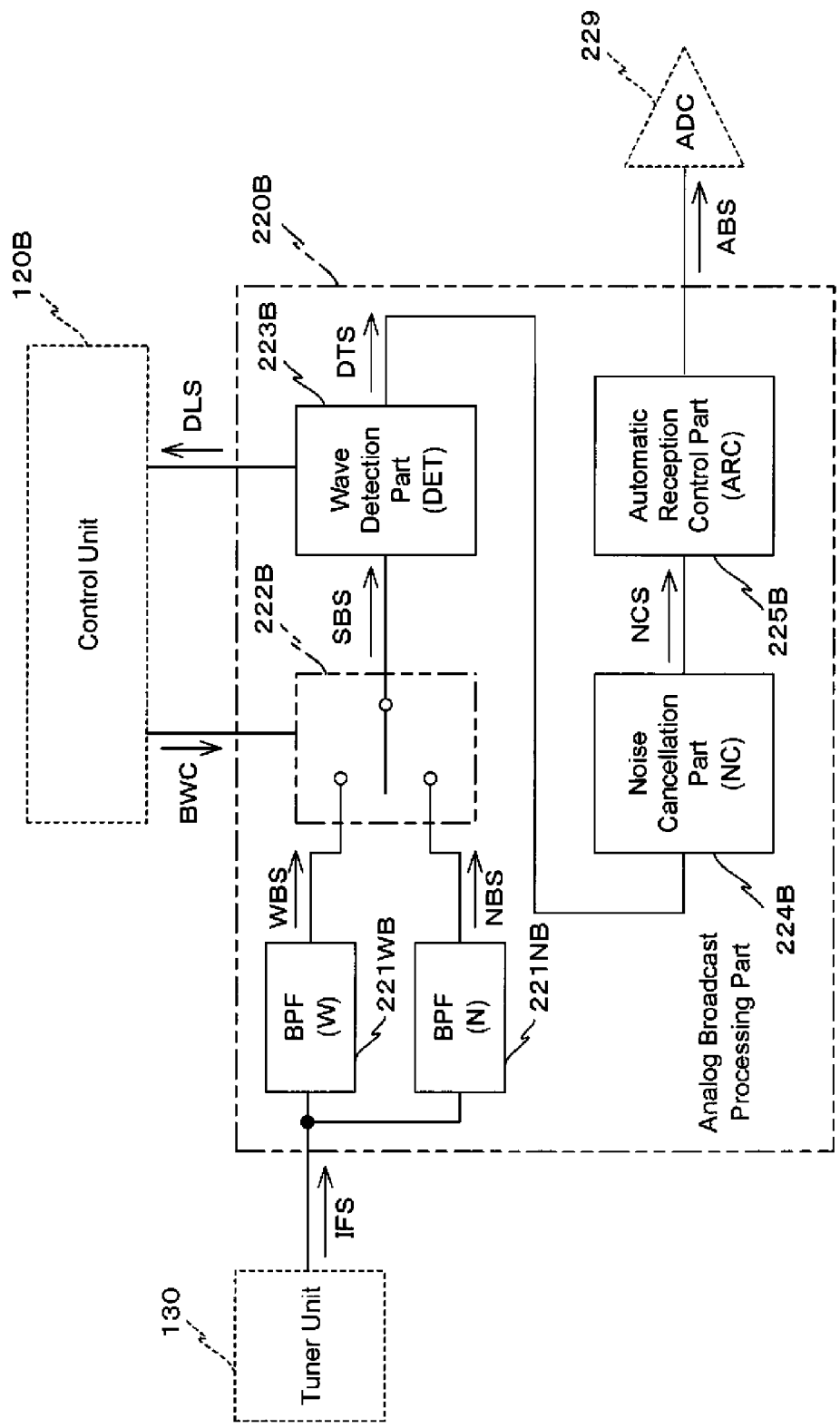
FIG. 16 is the block diagram showing the structure of an analog broadcast processing part of FIG. 15.

Next, the second embodiment of the present invention will be explained with reference principally to FIGS. 14 through 16.

<Structure>

Figure 14:
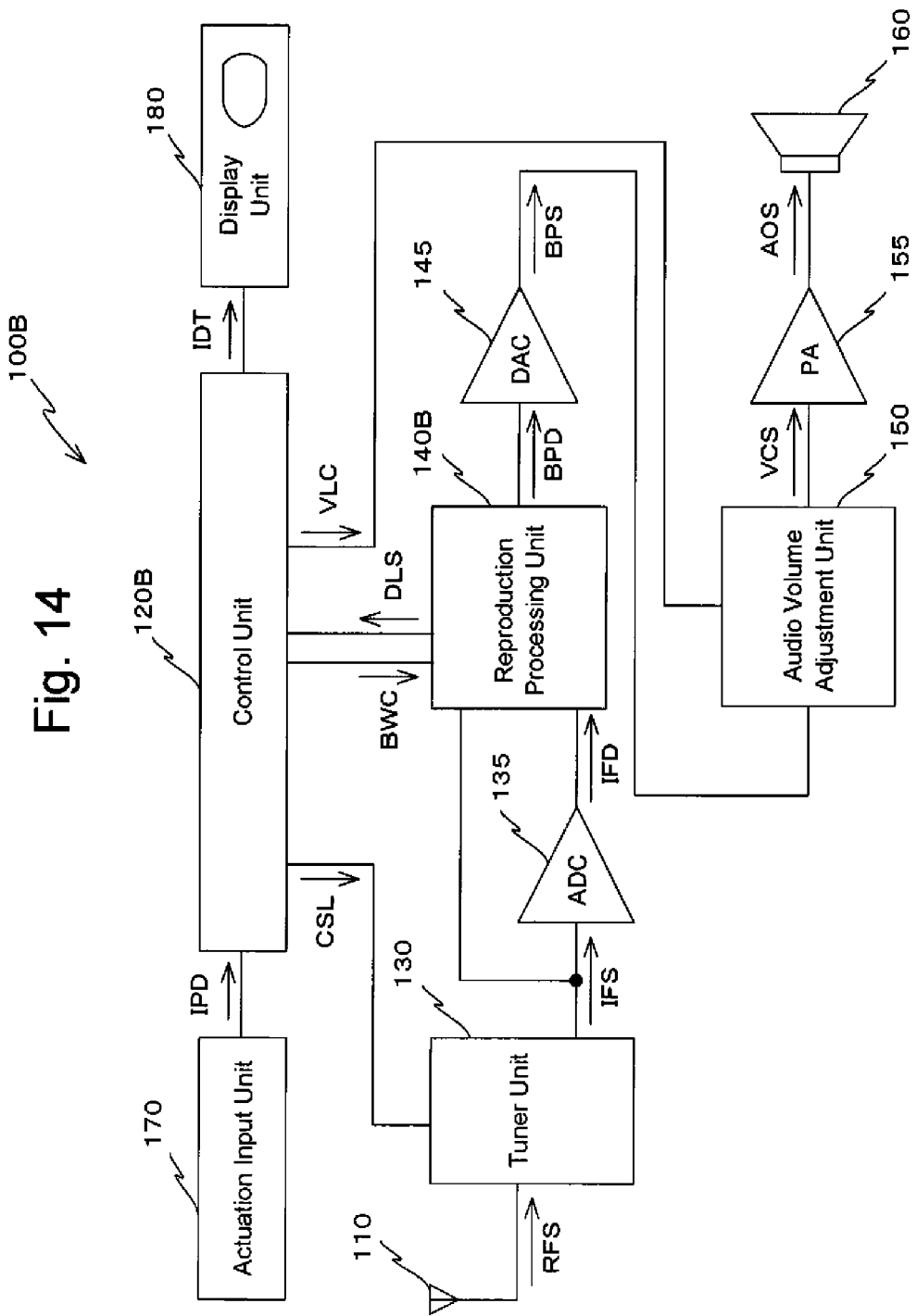
FIG. 14 is the block diagram schematically showing the structure of a broadcast receiving device according to the second embodiment of the present invention.

The schematic structure of a broadcast receiving device 100B according to a second embodiment is shown as a block diagram in FIG. 14. It should be understood that, in a similar manner to the broadcast receiving device 100A of the first embodiment, this broadcast receiving device 100B also is a broadcast receiving device which is capable of receiving and reproducing amplitude modulated radio broadcasts according to the IBOC system.

As shown in FIG. 14, as compared to the broadcast receiving device 100A described above, this broadcast receiving device 100B only differs in that it comprises a control unit 120B instead of the control unit 120A, and in that it comprises a reproduction processing unit 140B instead of the reproduction processing unit 140A. In the following, the explanation will principally focus upon these points of difference.

As compared to the control unit 120A, this control unit 120B only differs in that it has an analog input port at which is inputted the level detection signal DLS, which is reported as an analog signal. At this analog input port, the level detection signal DLS is converted to digital, and then it is supplied to the interior of the control unit 120B.

The reproduction processing unit 140B receives the tuning signal IFS from the tuner unit 130 and the digital tuning signal IFD from the ADC 135. And the reproduction processing unit 140B generates the processed broadcast signal BPD, similar to the case with the reproduction processing unit 140A. As shown in FIG. 15, as compared to the reproduction processing unit 140A, this reproduction processing unit 140B differs in that, instead of the analog broadcast processing part 220A, it comprises an analog broadcast processing part 220B, and in that it is additionally provided with an ADC 229.

The analog broadcast processing part 220B performs processing of the tuning signal IFS from the tuner unit 130, which is an analog signal, and generates a processed analog broadcast signal ABS, which is an analog signal. As compared with the analog broadcast processing part 220A, as shown in FIG. 16, this analog broadcast processing part 220B differs in that, instead of the elements 221A through 225A which are digital signal processing elements, it comprises elements 221B through 225B which are analog signal processing elements. These elements 221B through 225B perform the same processing as the elements 221A through 225A, by analog processing. Here, the signal level detected by the wave detection part 223B by the S-meter function is reported to the control unit 120B as the level detection signal DLS.

Returning to FIG. 15, the processed analog broadcast signal ABS which has been generated by the analog broadcast processing part 220B is sent to the ADC 229. Upon receipt of this processed analog broadcast signal ABS, the ADC 229 converts this processed analog broadcast signal ABS digitally, and generates therefrom a processed analog broadcast signal ABD, which is a digital signal. The processed analog broadcast signal ABD which has been generated in this manner is sent to the combination part 240.

<Operation>

The broadcast receiving device 100B having the structure as described above operates in a similar manner to the broadcast receiving device 100A of the first embodiment, except for the fact that, in the reproduction processing unit 140B, analog broadcast processing is performed by the analog broadcast processing part 220B as analog signal processing, and the result is converted to digital. And, when searching for a digital broadcast in a hybrid broadcast, in a similar manner to the broadcast receiving device 100A, the processing of FIGS. 8 through 13 described above is executed by the digital broadcast judgment part 122 of the control unit 120B.

As has been explained above, in this second embodiment, in a similar manner to the first embodiment described above, searching for a hybrid broadcast according to the IBOC system is performed while sequentially changing the selected channel, by collecting the signal level value $V_W$ of the signal WBS extracted on wide band, which is a signal of bandwidth suitable for reproduction of an analog broadcast, and the signal level value $V_N$ of the signal NBS extracted on narrow band, which is a signal of bandwidth around ΔF for which, in the case of the IBOC system, there is a possibility that neither a digital broadcast component nor an analog broadcast component is present. And the search for channels upon which hybrid broadcasting is being performed is conducted by deciding, only on the basis of these signal level values $V_W$ and $V_N$, for three consecutive channels, whether or not the first adjacent channel condition, the central channel condition, and the second adjacent channel condition are sequentially satisfied.

Thus according to this second embodiment, in a similar manner to the case for the first embodiment, since it is possible to perform this operation without analyzing the received contents and checking whether a digital broadcast is included therein, it is possible, when receiving a radio broadcast according to the IBOC system, promptly to decide whether or not a digital broadcast is included therein.

Modification of the Embodiment

The present invention should not be considered as being limited to the embodiments described above; many variations may be implemented.

For example, in the first and second embodiment described above, it is arranged to detect the signal levels of the signal WBD (WBS) and the signal NBD (NBS) by employing the S-meter function of the wave detection part 223A (223B). By contrast, it would also be possible to provide a signal level detection part which detects the signal levels of the signal WBD (WBS) and the signal NBD (NBS), separately from the wave detection part 223A (223B).

In this case, it would be possible to provide a single signal level detection part which is utilized for detecting the signal levels of the signal WBD (WBS) and the signal NBD (NBS), and to change over the signal which is the subject of detection by a switch, in a similar manner to the cases with the first and the second embodiments. Moreover, it would also be possible to provide a dedicated signal level detection part for each of the signals WBD (WBS) and NBD (NBS), and to perform detection of both of the signal levels in parallel.

Furthermore while, in the first and second embodiment described above, the explanation was made under the supposition that the predetermined value $V_{W1}$ and the predetermined value $V_{W2}$ were different values, it would also be possible for the predetermined value $V_{W1}$ and the predetermined value $V_{W2}$ to have the same value.

Furthermore while, in the first and second embodiment described above, the explanation was made under the supposition that the predetermined value $R_1$ and the predetermined value $R_2$ were different values, it would also be possible for the predetermined value $R_1$ and the predetermined value $R_2$ to have the same value.

Furthermore while, in the first and second embodiment described above, it was supposed that the scan direction for searching for a hybrid broadcast was determined in advance, it would also be possible to arrange for the user to be able to designate this scan direction by actuation input, in particular during the seek processing.

Furthermore, in the first and second embodiment described above, the condition for searching for a hybrid broadcast was taken as being that three consecutive channels satisfied the first adjacent channel condition, the central channel condition, and the second adjacent channel condition in order. By contrast, depending upon the reception environment such as a radio wave environment and the like, it would also be possible to take the condition for searching for a hybrid broadcast as being that two consecutive channels satisfy the first adjacent channel condition and the central channel condition in order, or satisfy the central channel condition and the second adjacent channel condition in order.

It should be understood that it would also be acceptable to arrange to constitute a portion or the entirety of the control units and the reproduction processing units of the first and the second embodiments described above as a computer, which serves as a calculation means, and which comprises a central processing device (CPU: Central Processing Unit), a DSP (Digital Signal Processor), a dedicated read out memory (ROM: Read Only Memory), a random access memory (RAM: Random Access Memory), and so on; and, by executing a program which is prepared in advance on that computer, to execute digital processing for the above described first and second embodiments. This program may be recorded upon a recording medium which can be read by a computer, such as a hard disk, a CD-ROM, a DVD, or the like, and may be read out by the above computer from this recording medium and executed. Furthermore, it would also be acceptable to arrange for this program to be acquired in the state of being recorded upon a transportable recording medium such as a CD-ROM, a DVD, or the like; or it would also be acceptable to arrange for the program to be acquired in a distribution format via a network such as the internet or the like.

The invention claimed is:

1. A broadcast receiving device, characterized by comprising:
   a tuner part configures to, according to a tuning command, convert a signal in a signal from a signal source, on a frequency band corresponding to said tuning command, to an intermediate frequency signal, which is a signal on an intermediate frequency band whose center frequency is a predetermined frequency;
   a first filter part configures to, if said predetermined frequency corresponds to a frequency of a carrier wave of an analog radio broadcast according to the amplitude modulation method, take said predetermined frequency as a center frequency, and selects from said intermediate frequency signal and passes through a signal on a first frequency band which is appropriate for reproducing broadcast contents from said analog radio broadcast;
   a second filter part configures to take said predetermined frequency as a center frequency, and select from said intermediate frequency signal and passes through a signal on a second frequency band whose bandwidth is narrower than said first frequency band;
   a first detection part configures to detect a first power level, which is the power level of the signal passed through said first filter part;
   a second detection part configures to detect a second power level, which is the power level of the signal passed through said second filter part;
   a tuning control part configures to issue said tuning command to said tuner part; and
   a judgment part configures to, on the basis of said first power level and said second power level obtained corresponding to a tuning command in which a specific channel is designated, and said first power level and said second power level obtained corresponding to a tuning command in which at least one adjacent channel to said specific channel is designated, make a judgment as to whether or not a digital radio broadcast which takes the center frequency of said specific channel as its center frequency is being performed according to an in-band-on-channel method.

2. A broadcast receiving device according to claim 1, characterized in that said judgment part configures to judge that a digital radio broadcast which takes the center frequency of said specific channel as its center frequency is being performed according to the in-band on-channel method, if a judgment condition is satisfied which includes: a first condition that, when said specific channel is designated by said tuning command, said first power level is greater than or equal to a first predetermined power level and also said second power level is less than or equal to a second predetermined power level; and a second condition that, when one of said adjacent channels is designated by said tuning command, said first power level is greater than or equal to a third predetermined power level and also the ratio of said second power level to said first power level is less than or equal to a predetermined value.

3. A broadcast receiving device according to claim 2, characterized in that, in said judgment condition there is further included a third condition, that when another said adjacent channel is designated by said tuning command, said first power level is greater than or equal to the third predetermined power level and also the ratio of said second power level to said first power level is less than or equal to a predetermined value.

4. A broadcast receiving device according to claim 3, characterized by further comprising a switch part configures to, according to a changeover command, supply said intermediate frequency signal to either said first filter part or said second filter part; and in that said judgment part issues said changeover command to said switch part.

5. A broadcast receiving device according to claim 3, characterized by further comprising a digital broadcast scan part configures to, for a plurality of radio broadcast channels which are determined as being arranged at predetermined frequency intervals, control said tuning control part so as to issue said tuning command in order of frequency.

6. A broadcast receiving device according to claim 2, characterized by further comprising a switch part configures to, according to a changeover command, supply said intermediate frequency signal to either said first filter part or said second filter part; and in that said judgment part issues said changeover command to said switch part.

7. A broadcast receiving device according to claim 2, characterized by further comprising a digital broadcast scan part configures to, for a plurality of radio broadcast channels which are determined as being arranged at predetermined frequency intervals, control said tuning control part so as to issue said tuning command in order of frequency.

8. A broadcast receiving device according to claim 1, characterized by further comprising a switch part configures to, according to a changeover command, supply said intermediate frequency signal to either said first filter part or said second filter part; and in that said judgment part issues said changeover command to said switch part.

9. A broadcast receiving device according to claim 8, characterized by further comprising a digital broadcast scan part configures to, for a plurality of radio broadcast channels which are determined as being arranged at predetermined frequency intervals, control said tuning control part so as to issue said tuning command in order of frequency.

10. A broadcast receiving device according to claim 1, characterized by further comprising a digital broadcast scan part configures to, for a plurality of radio broadcast channels which are determined as being arranged at predetermined frequency intervals, control said tuning control part so as to issue said tuning command in order of frequency.

11. A broadcast identification method, characterized by comprising:
   a tuning process of, according to a tuning command, converting a signal in a signal from a signal source, on a frequency band corresponding to said tuning command, to an intermediate frequency signal, which is a signal on an intermediate frequency band whose center frequency is a predetermined frequency;
   a first detection process of, if said predetermined frequency corresponds to a frequency of a carrier wave of an analog radio broadcast according to the amplitude modulation method, taking said predetermined frequency as a center frequency, extracting from said intermediate frequency signal a signal on a first frequency band which is appropriate for reproducing broadcast contents from said analog radio broadcast, and detecting the power level of this extracted signal;
   a second detection process of taking said predetermined frequency as a center frequency, extracting from said intermediate frequency signal a signal on a second frequency band whose bandwidth is narrower than said first frequency band, and detecting the power level of this extracted signal; and
   a judgment process of, on the basis of the result of detection by said first detection process and the result of detection by said second process when a specific channel has been designated by said tuning command, and the result of detection by said first detection process and the result of detection by said second process when at least one adjacent channel to said specific channel is designated by said tuning command, making a judgment as to whether or not a digital radio broadcast which takes the center frequency of said specific channel as its center frequency is being performed according to the in-band-on-channel method.

12. A broadcast identification program, characterized in that it causes a calculation part to execute a broadcast identification method according to claim 11.

13. A recording medium, characterized in that a broadcast identification program according to claim 12 is recorded thereupon, and can be read in by a calculation part.

* * * * *